United States Patent
Takeshita et al.

(10) Patent No.: US 11,872,636 B2
(45) Date of Patent: Jan. 16, 2024

(54) SURFACE-COATED CUTTING TOOL AND METHOD FOR MANUFACTURING SAME

(71) Applicant: SUMITOMO ELECTRIC HARDMETAL CORP., Itami (JP)

(72) Inventors: Hiroki Takeshita, Sorachi-gun (JP); Shuhei Misumi, Sorachi-gun (JP); Haruyo Fukui, Sorachi-gun (JP); Shinya Imamura, Sorachi-gun (JP); Kazuhiro Hirose, Sorachi-gun (JP)

(73) Assignee: Sumitomo Electric Hardmetal Corp., Itami (JP)

(*) Notice: Subject to any disclaimer, the term of this patent is extended or adjusted under 35 U.S.C. 154(b) by 731 days.

(21) Appl. No.: 15/567,149

(22) PCT Filed: Mar. 2, 2017

(86) PCT No.: PCT/JP2017/008300
§ 371 (c)(1),
(2) Date: Oct. 17, 2017

(87) PCT Pub. No.: WO2017/169498
PCT Pub. Date: Oct. 5, 2017

(65) Prior Publication Data
US 2018/0099335 A1     Apr. 12, 2018

(30) Foreign Application Priority Data
Mar. 28, 2016   (JP) .................. 2016-063935

(51) Int. Cl.
*B23B 27/14* (2006.01)
*C23C 14/32* (2006.01)
(Continued)

(52) U.S. Cl.
CPC .......... *B23B 27/14* (2013.01); *C23C 14/0021* (2013.01); *C23C 14/024* (2013.01);
(Continued)

(58) Field of Classification Search
CPC ..... B23B 27/14; C23C 14/024; C23C 28/044; C23C 14/0664; C23C 14/0641; B23F 21/00
See application file for complete search history.

(56) References Cited

U.S. PATENT DOCUMENTS 5,652,045 A * 7/1997 Nakamura ............. C23C 16/36
428/216
2007/0269610 A1    11/2007 Fukui et al.
(Continued)

FOREIGN PATENT DOCUMENTS

JP    H07-310174 A    11/1995
JP    2005-305576 A   11/2005
(Continued)

*Primary Examiner* — Laura A Auer
(74) *Attorney, Agent, or Firm* — McCarter & English, LLP; Michael A. Sartori

(57) ABSTRACT

A surface-coated cutting tool includes a base material and a coating film formed on a surface of the base material. The coating film includes a first alternating layer and a second alternating layer formed on the first alternating layer. The first alternating layer includes first and second layers. The second alternating layer includes third and fourth layers. One or a plurality of the first layers and one or a plurality of the second layers are layered alternately, and one or a plurality of the third layers and one or a plurality of the fourth layers are layered alternately.

8 Claims, 5 Drawing Sheets

(51) Int. Cl.
  *C23C 14/35* (2006.01)
  *C23C 14/06* (2006.01)
  *C23C 30/00* (2006.01)
  *C23C 28/00* (2006.01)
  *C23C 28/04* (2006.01)
  *C23C 14/02* (2006.01)
  *C23C 14/00* (2006.01)
  *B23F 21/00* (2006.01)
  *B23G 5/06* (2006.01)

(52) U.S. Cl.
  CPC ...... *C23C 14/0641* (2013.01); *C23C 14/0664* (2013.01); *C23C 14/325* (2013.01); *C23C 14/35* (2013.01); *C23C 28/044* (2013.01); *C23C 28/42* (2013.01); *C23C 28/44* (2013.01); *C23C 30/005* (2013.01); *B23B 2228/105* (2013.01); *B23F 21/00* (2013.01); *B23G 5/06* (2013.01)

(56) References Cited

U.S. PATENT DOCUMENTS

| | | |
|---|---|---|
| 2008/0152882 A1 | 6/2008 | Selinder et al. |
| 2010/0215912 A1* | 8/2010 | Kubota ............... C23C 14/0641 428/172 |
| 2011/0033723 A1 | 2/2011 | Kim et al. |
| 2011/0117342 A1* | 5/2011 | Sugita ................... B23C 5/1009 428/213 |
| 2012/0090247 A1* | 4/2012 | Miura ................. C23C 14/0036 51/309 |
| 2014/0193623 A1* | 7/2014 | Setoyama ............... B23B 27/14 428/216 |
| 2015/0203956 A1* | 7/2015 | Asari .................... C23C 30/005 428/216 |
| 2016/0175939 A1 | 6/2016 | Tanaka et al. |
| 2018/0071829 A1 | 3/2018 | Hirano |

FOREIGN PATENT DOCUMENTS

| | | |
|---|---|---|
| JP | 2006-152321 A | 6/2006 |
| JP | 2009-248238 A | 10/2009 |
| JP | 4960211 B2 | 6/2012 |
| KR | 2013-0060542 A | 6/2013 |
| KR | 10-2015-0043264 A | 4/2015 |
| WO | 2006/070730 A1 | 7/2006 |
| WO | WO-2014025057 A1 * | 2/2014 |
| WO | 2015/147241 A1 | 10/2015 |
| WO | 2015/186503 A1 | 12/2015 |

* cited by examiner

SURFACE-COATED CUTTING TOOL AND METHOD FOR MANUFACTURING SAME

TECHNICAL FIELD

The present invention relates to a surface-coated cutting tool and a method for manufacturing the surface-coated cutting tool. The present application claims a priority based on Japanese Patent Application No. 2016-063935 filed on Mar. 28, 2016. The entire content of Japanese Patent Application No. 2016-063935 is incorporated herein by reference.

BACKGROUND ART

Recent trends for cutting tools are as follows: a dry process employing no cutting fluid is required in view of global environmental protection; various types of workpieces are used; cutting speed becomes faster in order to further increase process efficiency; and the like. Due to such trends, a tool edge temperature tends to be increasingly higher. This leads to a reduced tool life and therefore leads to increased cost burden, with the result that characteristics required for a tool material are becoming increasingly severe.

Japanese Patent Laying-Open No. 07-310174 (Patent Document 1) discloses an example in which for a cutting tool or wear-resistant tool, a surface of a hard base material, such as a WC-based cemented carbide, cermet, or high-speed steel, is coated with an AlTiSi-based film as a hard coating layer in order to improve wear resistance and surface protection function. Examples of the AlTiSi-based film include $Al_xTi_{1-x-y}Si_yC_zN_{1-z}$ (where $0.05 \leq x \leq 0.75$, $0.01 \leq y \leq 0.1$, $0.6 \leq z \leq 1$).

Japanese Patent Laying-Open No. 2005-305576 (Patent Document 2) discloses a cutting tool in which a wear-resistant coating film is formed on a surface of a base material and a chipping-resistant coating film is formed on a surface of this wear-resistant coating film. The wear-resistant coating film is mainly composed of a carbide or carbonitride of $Ti_{1-x}Al_x$ (where $0.2 \leq x \leq 0.7$). The chipping-resistant coating film is mainly composed of a nitride or carbonitride of $Al_{1-a-b}Cr_aV_b$ (where $0.2 \leq a \leq 0.4$, $0 \leq b \leq 0.4$, $a+b \leq 0.4$). According to this cutting tool, the cutting edge is suppressed from being chipped or defective at an early stage of cutting, i.e., the base material is suppressed from being exposed, thereby supposedly improving the tool life.

A cutting tool disclosed in WO 2006/070730 (Patent Document 3) is directed to improvement in wear resistance and chipping resistance, and includes an alternating layer as a coating layer. In the alternating layer, one or more A layers and one or more B layers are layered alternately. Each of the A layers has characteristics, such as residual stress and hardness, different from those of each of the B layers. Accordingly, wear resistance and toughness of the whole of the coating layer can be supposedly improved.

CITATION LIST

Patent Document

PTD 1: Japanese Patent Laying-Open No. 07-310174
PTD 2: Japanese Patent Laying-Open No. 2005-305576
PTD 3: WO 2006/070730

SUMMARY OF INVENTION

A surface-coated cutting tool according to an embodiment of the present invention includes a base material and a coating film formed on a surface of the base material, the coating film including a first alternating layer and a second alternating layer formed on the first alternating layer, the first alternating layer including first and second layers, the second alternating layer including third and fourth layers, one or a plurality of the first layers and one or a plurality of the second layers being layered alternately, one or a plurality of the third layers and one or a plurality of the fourth layers being layered alternately, each of the one or plurality of the first layers being composed of a nitride or carbonitride of $Al_aCr_bM1_{1-a-b}$, respective atomic ratios of the metal atoms in the first layer satisfying $0.5 \leq a \leq 0.9$, $0 \leq b \leq 0.4$, and $0 \leq 1-a-b \leq 0.1$, each of the one or plurality of the second layers being composed of a nitride or carbonitride of $Al_cTi_dM2_{1-c-d}$, respective atomic ratios of the metal atoms in the second layer satisfying $0.35 \leq c \leq 0.7$, $0.3 \leq d \leq 0.7$, and $0 \leq 1-c-d \leq 0.1$, each of the one or plurality of the third layers being composed of a nitride or carbonitride of $Al_eTi_fM3_{1-e-f}$, respective atomic ratios of the metal atoms in the third layer satisfying $0.35 \leq e \leq 0.7$, $0.3 \leq f \leq 0.7$, and $0 \leq 1-e-f \leq 0.1$, each of the one or plurality of the fourth layers being composed of a nitride or carbonitride of $Al_gTi_hM4_{1-g-h}$, respective atomic ratios of the metal atoms in the fourth layer satisfying $0.35 \leq g \leq 0.7$, $0.3 \leq h \leq 0.7$, and $0 \leq 1-g-h \leq 0.1$, the atomic ratio e of Al in the third layer and the atomic ratio g of Al in the fourth layer satisfying $0.05 \leq |g-e| \leq 0.2$, the atomic ratio f of Ti in the third layer and the atomic ratio h of Ti in the fourth layer satisfying $0.05 \leq |h-f| \leq 0.2$, each of the M1, the M2, the M3, and the M4 being one or more elements selected from a group consisting of a group 4 element, a group 5 element, a group 6 element except Cr and Ti in a periodic table, Si, and B.

A method for manufacturing the surface-coated cutting tool according to one embodiment of the present invention includes: preparing the base material; forming the first alternating layer by alternately layering the one or plurality of the first layers and the one or plurality of the second layers through physical vapor deposition; and forming the second alternating layer on the first alternating layer by alternately layering the one or plurality of the third layers and the one or plurality of the fourth layers through the physical vapor deposition.

DESCRIPTION OF EMBODIMENTS

Figure 1:
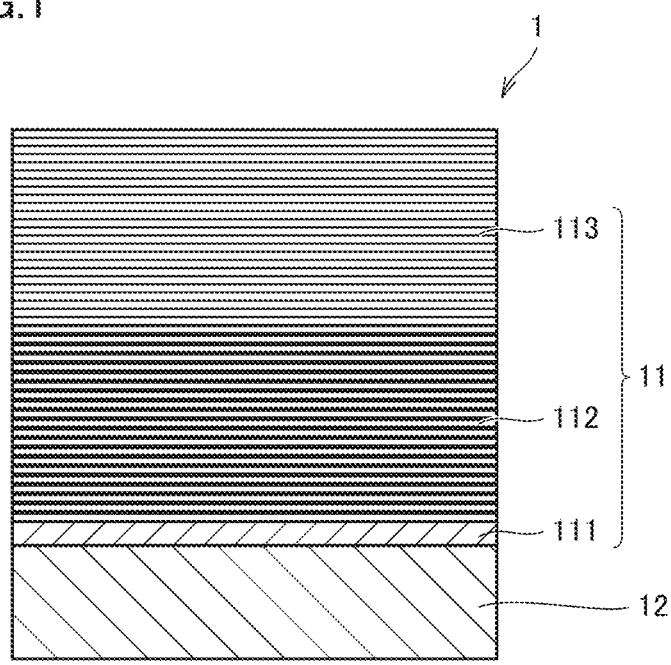
FIG. 1 is an explanatory cross sectional view schematically showing a cross section of a surface-coated cutting tool according to the present embodiment.

Problem to be Solved by the Present Disclosure

When the hard coating layer described in Patent Document 1 is used for a cutting tool, the cutting tool has high hardness and excellent oxidation resistance; however, the cutting tool is brittle and is likely to be chipped, disadvantageously.

When the cutting tool described in Patent Document 2 is used to cut a material, such as stainless steel, with which the cutting edge of the cutting tool is likely to be welded, the coating film is peeled off at an early stage of cutting due to insufficient adhesion between the chipping-resistant coating film and the wear-resistant coating film. Hence, there is room for improvement in terms of suppression of chipping of the coating film.

The cutting tool described in Patent Document 3 is likely to be welded at its cutting edge. Therefore, when processing a difficult-to-cut material that may cause welding of the cutting edge and peeling of the coating layer, the coating layer reacts with the workpiece at an early stage of the process to cause a crack between the A layer and the B layer. Accordingly, the layers are peeled off from each other, with the result that the cutting tool tends to have a short life. Therefore, there is room for improvement.

The present invention has been made in view of the above-described circumstances, and has an object to provide a surface-coated cutting tool exhibiting excellent chipping resistance and wear resistance, as well as a method for manufacturing such a surface-coated cutting tool.

Advantageous Effect of the Present Disclosure

According to the description above, excellent chipping resistance and wear resistance can be exhibited.

Description of Embodiments of the Present Invention

First, embodiments of the present invention are listed and described.

[1] A surface-coated cutting tool according to an embodiment of the present invention includes a base material and a coating film formed on a surface of the base material, the coating film including a first alternating layer and a second alternating layer formed on the first alternating layer, the first alternating layer including first and second layers, the second alternating layer including third and fourth layers, one or a plurality of the first layers and one or a plurality of the second layers being layered alternately, one or a plurality of the third layers and one or a plurality of the fourth layers being layered alternately, each of the one or plurality of the first layers being composed of a nitride or carbonitride of $Al_aCr_bM1_{1-a-b}$, respective atomic ratios of the metal atoms in the first layer satisfying $0.5 \leq a \leq 0.9$, $0 \leq b \leq 0.4$, and $0 \leq 1-a-b \leq 0.1$, each of the one or plurality of the second layers being composed of a nitride or carbonitride of $Al_cTi_dM2_{1-c-d}$, respective atomic ratios of the metal atoms in the second layer satisfying $0.35 \leq c \leq 0.7$, $0.3 \leq d \leq 0.7$, and $0 \leq 1-c-d \leq 0.1$, each of the one or plurality of the third layers being composed of a nitride or carbonitride of $Al_eTi_fM3_{1-e-f}$, respective atomic ratios of the metal atoms in the third layer satisfying $0.35 \leq e \leq 0.7$, $0.3 \leq f \leq 0.7$, and $0 \leq 1-e-f \leq 0.1$, each of the one or plurality of the fourth layers being composed of a nitride or carbonitride of $Al_gTi_hM4_{1-g-h}$, respective atomic ratios of the metal atoms in the fourth layer satisfying $0.35 \leq g \leq 0.7$, $0.3 \leq h \leq 0.7$, and $0 \leq 1-g-h \leq 0.1$, the atomic ratio e of Al in the third layer and the atomic ratio g of Al in the fourth layer satisfying $0.05 \leq |g-e| \leq 0.2$, the atomic ratio f of Ti in the third layer and the atomic ratio h of Ti in the fourth layer satisfying $0.05 \leq |h-f| \leq 0.2$, each of the M1, the M2, the M3, and the M4 being one or more elements selected from a group consisting of a group 4 element, a group 5 element, a group 6 element except Cr and Ti in a periodic table, Si, and B. The surface-coated cutting tool thus configured can exhibit excellent chipping resistance and wear resistance, can therefore endure severe cutting conditions, and can achieve excellent cutting edge quality.

[2] The atomic ratio c of Al in the second layer, the atomic ratio e of Al in the third layer, and the atomic ratio g of Al in the fourth layer satisfy $e \leq c \leq g$, and the atomic ratio d of Ti in the second layer, the atomic ratio f of Ti in the third layer, and the atomic ratio h of Ti in the fourth layer satisfy $h \leq d \leq f$. Accordingly, more excellent chipping resistance and wear resistance can be exhibited.

[3] An uppermost layer of the first alternating layer is the second layer. Accordingly, adhesion of the coating film can be increased.

[4] A lowermost layer of the first alternating layer is the first layer or the second layer. Accordingly, the coating film can be suppressed more from being peeled.

[5] Each of a thickness $\lambda 1$ of the first layer and a thickness $\lambda 2$ of the second layer is not less than 0.005 μm and not more than 2 μm, and $\lambda 1/\lambda 2$, which is a ratio of the thickness of the first layer and the thickness of the second layer, satisfies $1 \leq \lambda 1/\lambda 2 \leq 5$. Accordingly, oxidation resistance of the coating film can be improved and the coating film can have high hardness.

[6] Each of a thickness $\lambda 3$ of the third layer and a thickness $\lambda 4$ of the fourth layer is not less than 0.005 μm and not more than 2 μm, and $\lambda 3/\lambda 4$, which is a ratio of the thickness of the third layer and the thickness of the fourth layer, satisfies $1 \leq \lambda 3/\lambda 4 \leq 5$. Accordingly, a crack can be suppressed more from being developed in the coating film.

[7] The coating film has an entire thickness of not less than 0.5 μm and not more than 15 μm. Accordingly, the coating film can be excellent in chipping resistance, thus improving the tool life.

[8] The coating film includes an adhesion layer at the base material side relative to the first alternating layer, the adhesion layer has a thickness of not less than 0.5 nm and not more than 20 nm, the adhesion layer is a carbide, nitride, or carbonitride including a first element, a second element, and one or more elements selected from a group consisting of the elements of the base material, the first element is one or more elements selected from a group consisting of a group 4 element, a group 5 element, a group 6 element except Cr, Ti, Zr and Nb in a periodic table, Al, Si, and B, the second element is one or more elements selected from a group consisting of Cr, Ti, Zr, and Nb, and the one or more elements selected from the group consisting of the elements of the base material at least include W, and the W is diffused in the adhesion layer. Accordingly, adhesion between the coating film and the base material can be improved.

[9] The base material includes hard particles including WC and a binder phase for binding the hard particles, the binder phase includes Co, the adhesion layer is a carbide, nitride, or carbonitride including W, Cr, Ti, Al, and M5, and the M5 is one or more elements selected from a group consisting of a group 4 element, a group 5 element, a group 6 element except W, Cr, and Ti in the periodic table, Si and B. Accordingly, the adhesion between the coating film and the base material can be improved more.

[10] Each of the first alternating layer and the second alternating layer has a cubic crystal structure. Accordingly, hardness of the coating film can be improved.

[11] A method for manufacturing the surface-coated cutting tool according to one embodiment of the present invention includes: preparing the base material; forming the first alternating layer by alternately layering the one or plurality of the first layers and the one or plurality of the second layers through physical vapor deposition; and forming the second alternating layer on the first alternating layer by alternately layering the one or plurality of the third layers and the one or plurality of the fourth layers through the physical vapor deposition. Accordingly, a surface-coated cutting tool exhibiting excellent chipping resistance and wear resistance can be manufactured.

[12] The physical vapor deposition is at least one selected from a group consisting of a cathode arc ion plating method, a balanced magnetron sputtering method, and an unbalanced magnetron sputtering method. Accordingly, the surface-coated cutting tool having the above-described capability can be manufactured with a good yield.

Details of Embodiments of the Present Invention

The following describes an embodiment (hereinafter, referred to as "the present embodiment") of the present invention more in detail. The embodiment below will be described with reference to figures and the same reference characters in the figures represent the same or corresponding portions.

Here, in the present specification, the expression "X to Y" represents a range of upper to lower limits (i.e., not less than X and not more than Y). When no unit is indicated for X and a unit is indicated only for Y, the unit of X is the same as the unit of Y. Moreover, when a compound is expressed by a chemical formula in the present specification and an atomic ratio is not particularly limited, it is assumed that all the conventionally known atomic ratios are included. The atomic ratio is not necessarily limited only to one in the stoichiometric range. For example, when "TiAlN" is described, an atomic ratio in the TiAlN is not limited to Ti:Al:N=0.5:0.5:1, and include all the conventionally known atomic ratios. The same also applies to compounds other than the "TiAlN". In the present embodiment, a metallic element and a nonmetallic element does not necessarily need to constitute a stoichiometric composition. Examples of the metallic element include titanium (Ti), aluminum (Al), silicon (Si), tantalum (Ta), or chromium (Cr). Examples of the nonmetallic element include nitrogen (N), oxygen (O), and carbon (C).

<Surface-Coated Cutting Tool>

For example, as shown in FIG. 1, a surface-coated cutting tool according to the present embodiment includes a base material 12 and a coating film 11 formed on a surface of base material 12. Since surface-coated cutting tool 1 includes a below-described configuration, surface-coated cutting tool 1 exhibits excellent chipping resistance and wear resistance, can endure severe cutting conditions, and can achieve excellent cutting edge quality.

Therefore, the surface-coated cutting tool according to the present embodiment is very useful as a drill, an end mill, an indexable cutting insert for drill, an indexable cutting insert for end mill, an indexable cutting insert for milling, an indexable cutting insert for turning, a metal saw, a gear cutting tool, a reamer, a tap, an insert for crankshaft pin milling, or the like.

<Base Material>

For the base material, any conventionally known type of base material can be used. For example, the base material is preferably one of: a cemented carbide (inclusive of a WC (tungsten carbide) based cemented carbide, a cemented carbide including WC and Co, and a cemented carbide including WC and Co and additionally a carbonitride of Ti (titanium), Ta (tantalum), Nb (niobium) or the like, for example); a cermet (mainly composed of titanium carbide, titanium nitride, titanium carbonitride, or the like); a high-speed steel; a ceramic (titanium carbide, silicon carbide, silicon nitride, aluminum nitride, aluminum oxide, or the like); a cubic boron nitride sintered material; and a diamond sintered material. When the WC-based cemented carbide is used as the base material, one or both of free carbon and an abnormal layer called "η phase" may be included in the structure of the WC-based cemented carbide.

Among these various types of base materials, it is preferable to select the cemented carbide, particularly, the WC-based cemented carbide or to select the cermet (particularly, the titanium carbonitride based cermet). Each of these base materials is excellent in balance between hardness and strength particularly at a high temperature, and has characteristics excellent as a base material for the cutting tools in the above-described applications. Particularly, when the WC-based cemented carbide is selected, it is more preferable that: the base material includes hard particles including WC and includes a binder phase for binding the hard particles; and the binder phase includes Co.

Further, when the surface-coated cutting tool includes a below-described adhesion layer and the WC-based cemented carbide is selected as the base material, it is more preferable that WC occupies not less than 80% of an area in contact with the adhesion layer in view of adhesion between the base material and the coating film. Each of these base materials may have a modified surface. For example, a cemented carbide having a surface in which a β-free layer is formed does not fall out of the scope of the present invention.

It should be noted that when the cutting tool is an indexable cutting insert or the like, the base material may or may not include a chip breaker. The shape of the edge ridgeline includes any of a sharp edge (the ridge where the rake face and the flank face meet each other), a honed edge (a sharp edge processed to be rounded), a negative land (beveled), a combination of the honed edge and the negative land, and the like.

<Coating Film>

As shown in FIG. 1, the coating film includes a first alternating layer 112 and a second alternating layer 113 formed on first alternating layer 112. This first alternating layer 112 includes first and second layers. Second alternating layer 113 includes third and fourth layers. One or a plurality of the first layers and one or a plurality of the second layers are layered alternately. One or a plurality of the third layers and one or a plurality of the fourth layers are layered alternately. First alternating layer 112 is a multilayer film constituted of two or more layers to provide wear resistance in particular, and may be referred to as "wear-resistant layer" in the present specification. Moreover, since second alternating layer 113 is formed on first alternating layer 112, first alternating layer 112 may be referred to as "lower layer" in the present specification.

Second alternating layer 113 is a multilayer film constituted of two or more layers to provide chipping resistance in particular, and may be referred to as "chipping-resistant layer" in the present specification. Moreover, since second alternating layer 113 is formed on first alternating layer 112, second alternating layer 113 may be referred to as "upper layer" in the present specification.

In the present embodiment, coating film 11 covers base material 12. Coating film 11 preferably covers the entire surface of the base material; however, even when base material 12 is not partially covered with coating film 11 or even when respective layer structures of the layers of coating film 11 are partially different, these configurations do not fall out of the scope of the present invention.

The coating film can include another layer in addition to the first alternating layer, the second alternating layer, and the below-described adhesion layer. For example, the coating film can include an underlying layer as a layer formed to face the base material. Furthermore, the coating film can also include a surface protection layer as a layer for protecting a surface. Examples of the underlying layer can include a solid solution layer including an element of the coating film. The inclusion of the solid solution layer leads to more secured uniformity of the coating film. It should be noted that these layers can be formed by well-known formation methods.

Other examples of the underlying layer include a TiCNO layer, a TiBN layer, a TiC layer, a TiN layer, a TiAlN layer, a TiSiN layer, an AlCrN layer, a TiAlSiN layer, a TiAlNO layer, an AlCrSiCN layer, a TiCN layer, a TiSiC layer, a CrSiN layer, an AlTiSiCO layer, a TiSiCN layer, and the like. Examples of the surface protection layer include an $\alpha$-$Al_2O_3$ layer and a $\kappa$-$Al_2O_3$ layer.

In the present embodiment, the layer excellent in wear resistance and the layer excellent in chipping resistance are layered in the coating film, thereby eliminating a disadvantage of each layer such as brittleness while maintaining suitable characteristics intrinsic to each layer. Further, each of the layers is a multilayer in which the one or plurality of the layers of one of the two types and the one or plurality of the layers of the other of the two types are layered alternately, whereby the strength of the coating film can be improved significantly as compared with a case where each of the layers is constituted of a single layer. When each of the layers is constituted of a single layer, brittleness tends to be increased as the layer thickness becomes thicker; however, the tendency of increase in brittleness can be suppressed by layering the one or plurality of the layers of one of the two types and the one or plurality of the layers of the other of the two types alternately to construct the multilayer so as to control a thickness per unit layer to be thin.

In the present specification, the term "film" or "layer" is used for each constituent unit of the coating film for the purpose of convenience; however, such use of the terms is not intended to explicitly distinguish between the "film" and the "layer".

The coating film preferably has an entire thickness of not less than 0.5 μm and not more than 15 μm. The upper limit of the entire thickness is more preferably not more than 10 μm and is further preferably not more than 6 μm. The lower limit thereof is 0.5 μm. When the entire thickness of the coating film is less than 0.5 μm, the thickness of the coating film is too thin, with the result that the life of the surface-coated cutting tool tends to be short. On the other hand, when the entire thickness of the coating film is more than 15 μm, the coating film is likely to be chipped at an early stage of cutting, with the result that the life of the surface-coated cutting tool tends to be short. The entire thickness of the coating film is intended to mean the thickness of all of the first alternating layer, the second alternating layer, the below-described adhesion layer, and, if any, other layer(s).

Each of the first alternating layer and second alternating layer of the coating film preferably has a cubic crystal structure. Accordingly, the hardness of the coating film can be improved. When the whole or part of each of the first alternating layer and second alternating layer is amorphous, the hardness is decreased, with the result that the life of the surface-coated cutting tool tends to be short.

The entire thickness of the coating film can be adjusted by adjusting a film formation time appropriately. Moreover, the expression "thickness of the coating film" in the present specification is intended to mean an average thickness of the coating film. The thickness of the coating film can be measured, for example, by forming the coating film on an appropriate base material, cutting it at an appropriate position, and observing the cross section thereof using a scanning electron microscope (SEM), a transmission electron microscope (TEM), a scanning transmission electron microscope (STEM), or the like. The sample for the cross sectional observation can be produced using, for example, a focused ion beam system (FIB), a cross section polisher (CP), or the like. For example, cross sections are obtained at ten positions of the coating film, respective thicknesses in the cross sections are measured, and an average value of the measured values can be employed as the "thickness of the coating film". Further, the composition of the elements of the coating film can be measured using an energy dispersive X-ray spectroscopy (EDX) provided with an SEM or TEM. The below-described thicknesses and compositions of the first to fourth layers can be measured using a method similar to the above-described method.

<<First Alternating Layer (Lower Layer, Wear-Resistant Layer)>>

Figure 2:
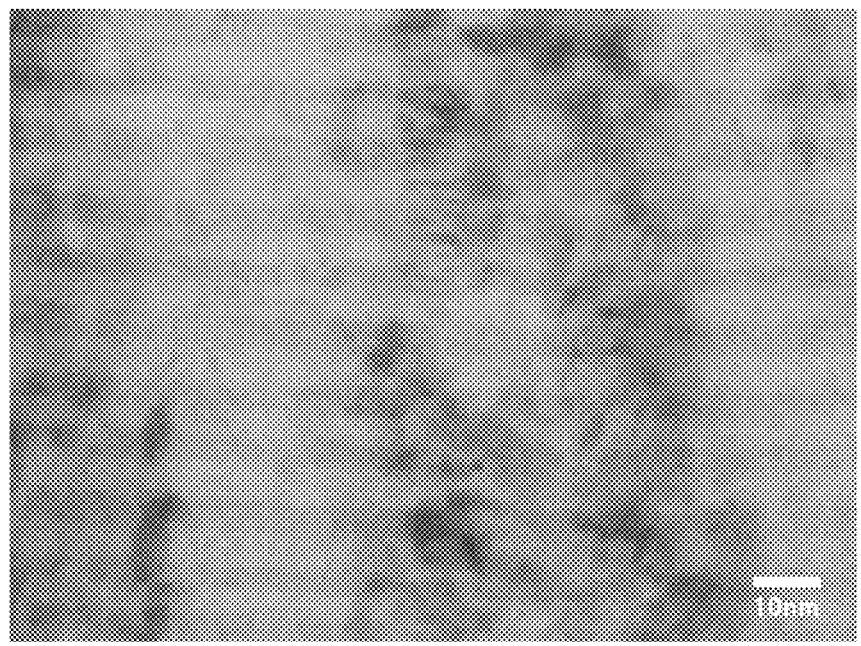
FIG. 2 is a diagram of photograph of a lower layer (first alternating layer) of a coating film in the present embodiment as captured by a microscope.

As shown in FIG. 1 and FIG. 2, first alternating layer 112 includes the first and second layers as described above. The one or plurality of the first layers and the one or plurality of the second layers are layered alternately. Particularly, each of thickness $\lambda 1$ of the first layer and thickness $\lambda 2$ of the second layer is preferably not less than 0.005 μm and not more than 2 μm. When each of thickness $\lambda 1$ of the first layer and thickness $\lambda 2$ of the second layer is less than 0.005 μm, the layers are mixed, with the result that an effect of layering the first and second layers alternately tends to be unobtainable. On the other hand, when each of thickness $\lambda 1$ of the first layer and thickness $\lambda 2$ of the second layer is more than 2 μm, the effect of suppressing development of cracks tends to be unobtainable. In order to increase wear resistance and oxidation resistance of the first alternating layer, each of thickness $\lambda 1$ of the first layer and thickness $\lambda 2$ of the second layer is more preferably not less than 0.005 μm and not more than 0.5 μm.

Further, $\lambda 1/\lambda 2$, which is a ratio of the thicknesses of the first and second layers, preferably satisfies $1 \leq \lambda 1/\lambda 2 \leq 5$. When $\lambda 1/\lambda 2$ is less than 1, the oxidation resistance of the coating film tends to be decreased. On the other hand, when $\lambda 1/\lambda 2$ is more than 5, the effect of suppressing development of cracks by layering the first and second layers alternately tends to unobtainable. In order to increase the wear resistance and oxidation resistance of the first alternating layer, $\lambda 1/\lambda 2$ more preferably satisfies $1 \leq \lambda 1/\lambda 2 \leq 4$.

(First Layer)

The first layer is composed of a nitride or carbonitride of $Al_aCr_bM1_{1-a-b}$, and respective atomic ratios of the metal atoms in the first layer satisfy $0.5 \leq a \leq 0.9$, $0 \leq b \leq 0.4$, and $0 \leq 1-a-b \leq 0.1$. Since the first layer is a nitride or carbonitride, the following effects are obtained: the hardness of the film becomes high and the wear resistance is improved; and the coefficient of friction with the workpiece becomes small to improve welding resistance.

Since the first layer includes Al (aluminum) and Cr (chromium), oxidation resistance is improved. Further, due to the combination of Al and Cr, the first layer has a cubic crystal structure, thus attaining high hardness.

Particularly, atomic ratio b of Cr in the first layer is more than 0 and not more than 0.4. Atomic ratio b of Cr needs to be larger than 0 in order to attain high hardness of the first layer by way of the combination of Al and Cr. On the other hand, when atomic ratio b of Cr is more than 0.4, the hardness of the first layer tends to be decreased. In order to further improve the hardness and oxidation resistance of the first layer, atomic ratio b of Cr is preferably not less than 0.2 and not more than 0.34 ($0.2 \leq b \leq 0.34$).

Furthermore, atomic ratio a of Al in the first layer is not less than 0.5 and not more than 0.9. When atomic ratio a of Al is less than 0.5, the oxidation resistance of the coating film tends to be decreased. On the other hand, when atomic ratio a of Al is more than 0.9, the hardness tends to be decreased and the wear tends to be promoted. In order to further improve the hardness and oxidation resistance of the first layer, atomic ratio a of Al is more preferably not less than 0.56 and not more than 0.7 ($0.56 \leq a \leq 0.7$).

M1 is one or more elements selected from a group consisting of a group 4 element (Zr, Hf, or the like), a group 5 element (V, Nb, Ta, or the like), a group 6 element (Mo, W, or the like) except Cr and Ti in the periodic table, Si (silicon), and B (boron). With such element(s), the heat resistance, film hardness, and welding resistance of the first layer are improved. Specifically, M1 is preferably one of B, Si, Zr, V, Nb, W, and Ta.

It should be noted that B (boron) is normally regarded as a semimetal exhibiting an intermediate characteristic between a metallic element and a nonmetallic element; however, in the present embodiment, an element having a free electron is assumed to be a metal and boron is regarded as a metal.

(Second Layer)

The second layer is composed of a nitride or carbonitride of $Al_cTi_dM2_{1-c-d}$, and respective atomic ratios of the metal atoms in the second layer satisfy $0.35 \leq c \leq 0.7$, $0.3 \leq d \leq 0.7$, and $0 \leq 1-c-d \leq 0.1$. Since the second layer is a nitride or carbonitride, the following effects are obtained: the hardness of the film becomes high and the wear resistance is improved; and the coefficient of friction with the workpiece becomes small to improve welding resistance.

Since the second layer includes Al and Ti, wear resistance thereof is improved. Further, since Al and Ti are combined in the second layer, an effect of improving the oxidation resistance more as an amount of addition of Al is increased is obtained.

Particularly, atomic ratio c of Al in the second layer is not less than 0.35 and not more than 0.7. When atomic ratio c of Al is less than 0.35, the oxidation resistance of the coating film tends to be decreased. On the other hand, when atomic ratio c of Al is more than 0.7, the hardness of the second layer tends to be decreased and the wear tends to be promoted. In order to further improve the wear resistance and oxidation resistance of the second layer, atomic ratio c of Al is more preferably not less than 0.4 and not more than 0.65 ($0.4 \leq c \leq 0.65$).

Furthermore, atomic ratio d of Ti in the second layer is not less than 0.3 and not more than 0.7. When atomic ratio d of Ti is less than 0.3, the hardness tends to be decreased and the wear tends to be promoted. On the other hand, when atomic ratio d of Ti is more than 0.7, the amount of addition of Al of the coating film is decreased relatively, with the result that the oxidation resistance tends to be decreased. In order to further improve the wear resistance and oxidation resistance of the second layer, atomic ratio d of Ti is more preferably not less than 0.4 and not more than 0.6 ($0.4 \leq d \leq 0.6$).

M2 is one or more elements selected from a group consisting of a group 4 element, a group 5 element, a group 6 element except Cr and Ti in the periodic table, Si, and B. With such element(s), the heat resistance, film hardness, and welding resistance of the second layer are improved. Specifically, M2 is preferably one of B, Si, Zr, V, Nb, W, and Ta. M1 and M2 are the same or different. That is, M1 and M2 may be the same element or may be different elements.

In the first alternating layer, the lowermost layer is preferably the first layer or the second layer. When the lowermost layer is the first layer or the second layer, adhesion of the entire film becomes uniform, thus suppressing peeling at an interface between the coating film and the base material. When the lowermost layer is the first layer, oxidation from the interface between the base material and the coating film can be suppressed even if the base material is exposed as a result of development of wear. Further, when the lowermost layer is the second layer, the second layer tends to have small stress, whereby peeling resistance of the coating film tends to be remarkably improved particularly in the case of an intermittent process that involves repeated application of load on the cutting edge, such as milling or end milling.

In the first alternating layer, the uppermost layer is preferably the second layer. Since the uppermost layer is the second layer, the adhesion between the first alternating layer and the second alternating layer can be increased as described later.

Further, both or one of the lowermost layer and the uppermost layer in the first alternating layer may be mixed layer(s) composed of a compound having a composition in which the compound of the first layer and the compound of the second layer are mixed. The composition of the mixed layer is constituted of the elements of the first and second layers, such as TiAlCrN, TiAlCrCN, TiAlCrC, TiAlCrSiN, TiAlCrSiCN, or TiAlCrSiC.

<<Second Alternating Layer (Upper Layer, Chipping-Resistant Layer)>>

As shown in FIG. 1, second alternating layer 113 is formed on first alternating layer 112 opposite to the base material side of first alternating layer 112. Second alternating layer 113 includes the third and fourth layers. The one or plurality of the third layers and the one or plurality of the fourth layers are layered alternately. Particularly, each of thickness λ3 of the third layer and thickness λ4 of the fourth layer is preferably not less than 0.005 μm and not more than 2 μm. When each of thickness λ3 of the third layer and thickness λ4 of the fourth layer is less than 0.005 μm, the layers are mixed and the effect of alternately layering the third and fourth layers tends to be unobtainable. On the other hand, when each of thickness λ3 of the third layer and thickness λ4 of the fourth layer is more than 2 μm, the effect of suppressing development of cracks tends to be obtained unlikely. In order to increase the wear resistance and crack development resistance of the second alternating layer, each of thickness λ3 of the third layer and thickness λ4 of the fourth layer is more preferably not less than 0.005 μm and not more than 0.5 μm.

Further, λ3/λ4, which is a ratio of the thicknesses of the third layer and the fourth layer, preferably satisfies $1 \leq \lambda3/\lambda4 \leq 5$. When λ3/λ4 is less than 1 and when λ3/λ4 is more than 5, the effect of suppressing development of cracks tends to be obtained unlikely. In order to improve the crack development resistance of the second alternating layer, $\lambda 3/\lambda 4$ more preferably satisfies $1 \leq \lambda 3/\lambda 4 \leq 4$.

(Third Layer)

The third layer is composed of a nitride or carbonitride of $Al_e Ti_f M3_{1-e-f}$, and respective atomic ratios of the metal atoms in the third layer satisfy $0.35 \leq e \leq 0.7$, $0.3 \leq f \leq 0.7$, and $0 \leq 1-e-f \leq 0.1$. Since the third layer is a nitride or carbonitride, the following effects are obtained: the hardness of the film becomes high and the wear resistance is improved; and the coefficient of friction with the workpiece becomes small to improve the welding resistance.

Since the third layer includes Al and Ti, the wear resistance is improved. Further, since Al and Ti are combined in the third layer, there is obtained an effect of improving oxidation resistance more as an amount of addition of Al is increased.

Particularly, atomic ratio e of Al in the third layer is not less than 0.35 and not more than 0.7. When atomic ratio e of Al is less than 0.35, the oxidation resistance of the coating film tends to be decreased. On the other hand, when atomic ratio e of Al is more than 0.7, the hardness of the third layer tends to be decreased and the wear tends to be promoted. In order to further improve the wear resistance and oxidation resistance of the third layer, atomic ratio e of Al is more preferably not less than 0.4 and not more than 0.65 ($0.4 \leq e \leq 0.65$).

Furthermore, atomic ratio f of Ti in the third layer is not less than 0.3 and not more than 0.7. When atomic ratio f of Ti is less than 0.3, the hardness tends to be decreased and the wear tends to be promoted. On the other hand, when atomic ratio f of Ti is more than 0.7, the amount of addition of Al of the coating film is decreased relatively, with the result that the oxidation resistance tends to be decreased. In order to further improve the wear resistance and oxidation resistance of the third layer, atomic ratio f of Ti is more preferably not less than 0.4 and not more than 0.6 ($0.4 \leq f \leq 0.6$).

M3 is one or more elements selected from a group consisting of a group 4 element, a group 5 element, a group 6 element except Cr and Ti in the periodic table, Si, and B. With such element(s), the heat resistance, film hardness, and welding resistance of the third layer are improved. Specifically, M3 is preferably one of B, Si, Zr, V, Nb, W, and Ta. M1 to M3 are the same or different. Namely, M1, M2 and M3 may be the same element or different elements. However, in order to increase the adhesion between the first alternating layer and the second alternating layer, M2 and M3 are preferably the same.

(Fourth Layer)

The fourth layer is composed of a nitride or carbonitride of $Al_g Ti_h M4_{1-g-h}$, and respective atomic ratios of the metal atoms in the fourth layer satisfy $0.35 \leq g \leq 0.7$, $0.3 \leq h \leq 0.7$, and $0 \leq 1-g-h \leq 0.1$. Since the fourth layer is a nitride or carbonitride, the following effects are obtained: the hardness of the film becomes high and the wear resistance is improved; and the coefficient of friction with the workpiece becomes small to improve the welding resistance.

Since the fourth layer includes Al and Ti, wear resistance is improved. Further, since Al and Ti are combined in the fourth layer, there is obtained an effect of improving the oxidation resistance more as an amount of addition of Al is increased.

Particularly, atomic ratio g of Al in the fourth layer is not less than 0.35 and not more than 0.7. When atomic ratio g in Al is less than 0.35, the oxidation resistance of the coating film tends to be decreased. On the other hand, when atomic ratio g of Al is more than 0.7, the hardness of the fourth layer tends to be decreased and the wear tends to be promoted. In order to further improve the wear resistance and oxidation resistance of the fourth layer, atomic ratio g of Al is more preferably not less than 0.4 and not more than 0.65 ($0.4 \leq g \leq 0.65$).

Furthermore, atomic ratio h of Ti in the fourth layer is not less than 0.3 and not more than 0.7. When atomic ratio h of Ti is less than 0.3, the hardness tends to be decreased and the wear tends to be promoted. On the other hand, when atomic ratio h of Ti is more than 0.7, the amount of addition of Al of the coating film is decreased relatively, with the result that the oxidation resistance tends to be decreased. In order to further improve the wear resistance and oxidation resistance of the fourth layer, atomic ratio h of Ti is more preferably not less than 0.4 and not more than 0.6 ($0.4 \leq h \leq 0.6$).

M4 is one or more elements selected from a group consisting of a group 4 element, a group 5 element, a group 6 element except Cr and Ti in the periodic table, Si, and B. With such element(s), the heat resistance, film hardness, and welding resistance of the fourth layer are improved. Specifically, M4 is preferably one of B, Si, Zr, V, Nb, W, and Ta. M1 to M4 are the same or different. Namely, M1, M2, M3, and M4 may be the same element or different elements. However, in order to increase the adhesion between the third layer and the fourth layer, M3 and M4 are preferably the same.

The second alternating layer is preferably formed on the uppermost layer of the first alternating layer with the uppermost layer of the first alternating layer being constituted of the second layer. Since the second layer in the first alternating layer has a composition close to those of the third and fourth layers of the second alternating layer, adhesion between the first alternating layer and the second alternating layer can be increased. In view of this, the uppermost layer and lowermost layer of the second alternating layer may be either of the third layer and the fourth layer.

Further, atomic ratio c of Al in the second layer, atomic ratio e of Al in the third layer, and atomic ratio g of Al in the fourth layer preferably satisfy $e \leq c \leq g$. Atomic ratio d of Ti in the second layer, atomic ratio f of Ti in the third layer, and atomic ratio h of Ti in the fourth layer preferably satisfy $h \leq d \leq f$. Accordingly, the hardness of the entire coating film can be harder while improving the adhesion between the first alternating layer and the second alternating layer, whereby excellent chipping resistance and wear resistance can be obtained.

Figure 3A:
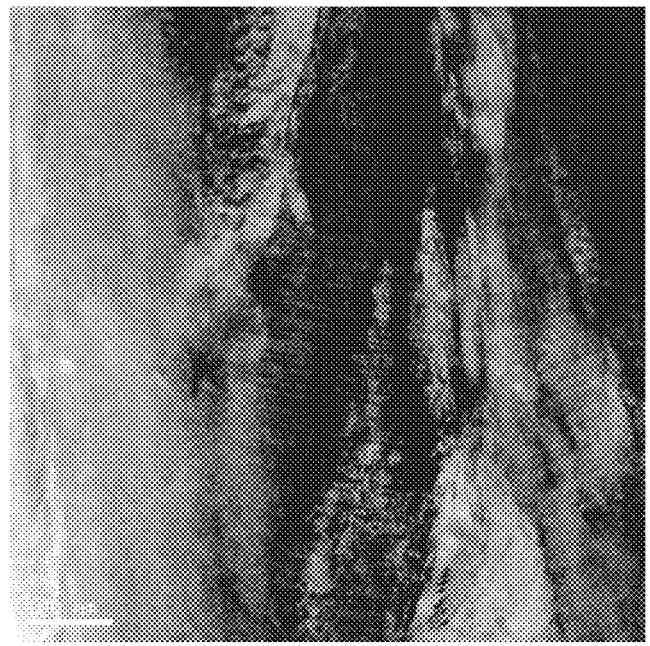
FIG. 3A is a diagram of photograph of an upper layer (second alternating layer) of the coating film in the present embodiment as captured by a microscope.

Here, in the present embodiment, the third and fourth layers each serving as the chipping-resistant layer are intentionally configured to have very similar constituent elements and composition ratios. Accordingly, the chipping-resistant layer (second alternating layer) can be observed as if it macroscopically had a single composition as shown in FIG. 3A.

Figure 3B:
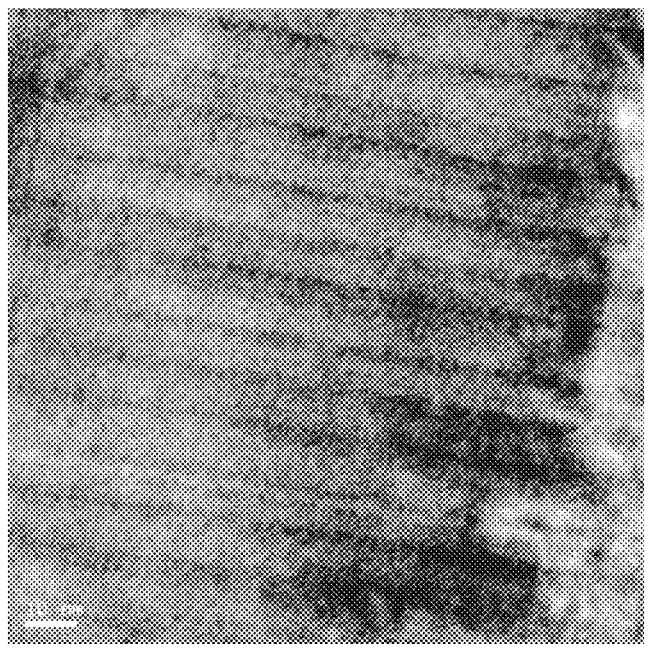
FIG. 3B is an enlarged diagram of photograph of FIG. 3A.

However, atomic ratio e of Al in the third layer and atomic ratio g of Al in the fourth layer satisfy $0.05 \leq |g-e| \leq 0.2$, whereas atomic ratio f of Ti in the third layer and atomic ratio h of Ti in the fourth layer satisfy $0.05 \leq |h-f| \leq 0.2$. Accordingly, at least the respective composition ratios of the third layer and the fourth layer do not become the same. Accordingly, as shown in FIG. 3B, microscopically, two types of streak portions or laminar portions are observed, whereby the third layer can be distinguished from the fourth layer. Particularly, from a microphotograph shown in FIG. 3B, it is understood that there is an interface (plane having a slight strain not so large as to be a dislocation) between the third layer and the fourth layer to distinguish between the third layer and the fourth layer.

Since the chipping-resistant layer has this interface, a crack can be suppressed from being propagated between the third layer and the fourth layer when the crack is generated in the coating film. Further, since the constituent elements and composition ratios of the third layer and the fourth layer are very similar, a crystal lattice can be continuous between the third layer and the fourth layer. Accordingly, the third layer and the fourth layer can have increased adhesion.

<<Adhesion Layer>>

Figure 4A:
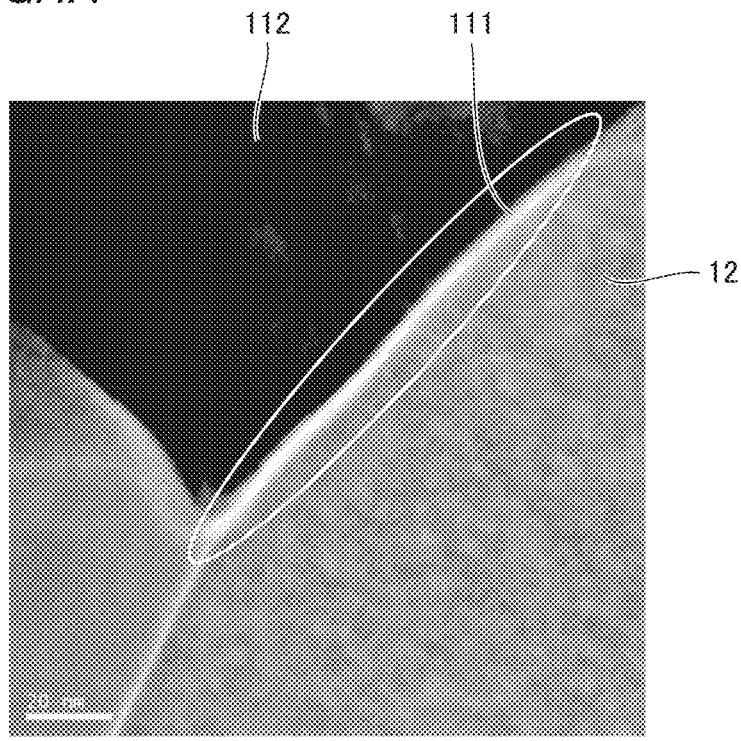
FIG. 4A is a diagram of photograph of an adhesion layer of the coating film in the present embodiment as captured by a microscope.
Figure 4B:
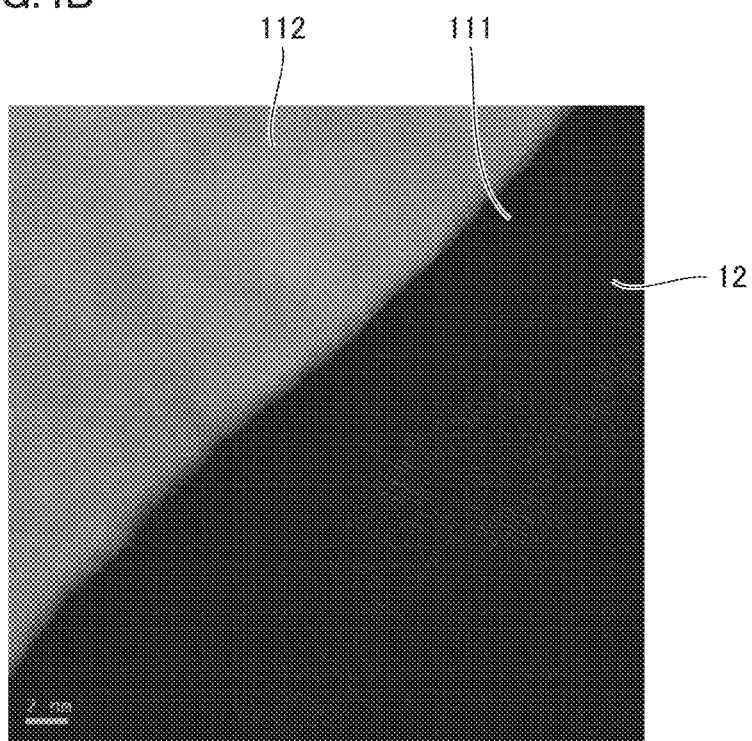
FIG. 4B is an enlarged diagram of photograph of FIG. 4A.

As shown in FIG. 1, FIG. 4A, and FIG. 4B, coating film 11 preferably includes an adhesion layer 111 at the base material 12 side relative to first alternating layer 112. That is, coating film 11 preferably includes adhesion layer 111 between first alternating layer 112 and base material 12. In coating film 11, adhesion layer 111 is more preferably configured to be in contact with first alternating layer 112 and base material 12. Since coating film 11 includes adhesion layer 111, coating film 11 is prevented from being peeled off from base material 12, thereby stabilizing the life of surface-coated cutting tool 1.

The thickness of the adhesion layer is preferably not less than 0.5 nm and not more than 20 nm. When the thickness of the adhesion layer is less than 0.5 nm, sufficient adhesion force may not be obtained because the thickness is too thin. When the thickness of the adhesion layer is more than 20 nm, residual stress in the adhesion layer is increased, with the result that coating film 11 is more likely to be peeled off. The thickness of the adhesion layer is more preferably not less than 0.5 nm and not more than 10 nm, and is particularly preferably not less than 2 nm and not more than 6 nm. The thickness of the adhesion layer can also be measured by TEM, STEM, or the like. The thickness of the adhesion layer may be measured by obtaining cross-sectional samples of the adhesion layer in the same manner as in the measurement of the thickness of the coating film. A sample for cross-sectional observation can be obtained in the same manner as in the measurement of the thickness of the coating film. The thickness of the adhesion layer is an average thickness and is an average value of measured values.

The adhesion layer is preferably a carbide, nitride, or carbonitride of a first element, a second element, and one or more elements selected from a group consisting of the elements of the base material. The first element is one or more elements selected from the elements of the first alternating layer except Cr, Ti, Zr (zirconium) and Nb. The second element is one or more elements selected from a group consisting of Cr, Ti, Zr, and Nb. The one or more elements selected from the group consisting of the elements of the base material at least include W and this W is diffused in the adhesion layer. Specifically, the first element is preferably one or more elements selected from Al, Si, B, V, and Ta. Since the adhesion layer is composed of a carbide, nitride, or carbonitride, the adhesion is improved significantly. Further, since W, which is one of the elements of the base material, is included and this W is diffused in the adhesion layer, adhesion between the base material and the adhesion layer can be improved further.

For example, in the surface-coated cutting tool according to the present embodiment, the base material includes: hard particles including WC; and a binder phase for binding the hard particles. The binder phase preferably includes Co. Particularly, the adhesion layer is preferably a carbide, nitride, or carbonitride including W, Cr, Ti, Al, and M5. M5 is preferably one or more elements selected from a group consisting of a group 4 element, a group 5 element, a group 6 element except W, Cr and Ti in the periodic table, Si, and B. Specifically, M5 is more preferably one of Si, B, Zr, V, Nb, and Ta.

Specifically, the adhesion layer is desirably composed of a compound containing an element having a chemical compatibility with both the base material and the first alternating layer, and can be a carbide, nitride, or carbonitride including an element (for example, W or C in the case of a cemented carbide) of the base material and an element (Cr, Ti, Al, Si, B, N, or the like) of the first alternating layer. Particularly, since such a carbide, nitride, or carbonitride includes one or more elements selected from the group consisting of Cr, Ti, Zr, and Nb, the adhesion can be improved significantly, thereby more stabilizing the life of the surface-coated cutting tool. The thickness, constituent elements, and composition ratio of the adhesion layer can be measured by an EDX provided with an SEM or TEM.

Hereinafter, specific examples of the carbide, nitride, or carbonitride of the adhesion layer include the following (a) to (j):

(a) a carbide, nitride, or carbonitride including Ti and W (for example, WTiC, WTiN, WTiCN, or the like);

(b) a carbide, nitride, or carbonitride including Cr and W (for example, WCrC, WCrN, WCrCN, or the like);

(c) a carbide, nitride, or carbonitride including Ti, Cr, and W (for example, WCrTiC, WCrTiN, WCrTiCN, or the like);

(d) a carbide, nitride, or carbonitride including Ti, Al, and W (for example, WTiAlC, WTiAlN, WTiAlCN, or the like);

(e) a carbide, nitride, or carbonitride including Ti, Si, and W (for example, WTiSiC, WTiSiN, WTiSiCN, or the like);

(f) a carbide, nitride, or carbonitride including Ti, Cr, Al, and W (for example, WCrTiAlC, WCrTiAlN, WCrTiAlCN, or the like);

(g) a carbide, nitride, or carbonitride including Ti, Cr, Si, and W (for example, WCrTiSiC, WCrTiSiN, WCrTiSiCN, or the like);

(h) a carbide, nitride, or carbonitride including Ti, Al, Si, and W (for example, WTiAlSiC, WTiAlSiN, WTiAlSiCN, or the like);

(i) a carbide, nitride, or carbonitride including Ti, Cr, Al, Si, and W (for example, WCrTiAlSiC, WCrTiAlSiN, WCrTiAlSiCN, or the like); and (j) a carbide, nitride, or carbonitride in which the whole or part of Cr is replaced with one or more elements selected from Ti, Zr, and Nb in one of (a) to (i) above.

<Method for Manufacturing Surface-Coated Cutting Tool>

A method for manufacturing the surface-coated cutting tool according to the present embodiment includes: a first step of preparing the base material; a second step of forming the first alternating layer by alternately layering the one or plurality of the first layers and the one or plurality of the second layers through physical vapor deposition; and a third step of forming the second alternating layer on the first alternating layer by alternately layering the one or plurality of the third layers and the one or plurality of the fourth layers through the physical vapor deposition.

In the method for manufacturing the surface-coated cutting tool, a coating film having wear resistance is intended to be formed on the surface of the base material, so that it is desirable to form a layer composed of a compound having high crystallinity. In order to develop such a coating film, the present inventor studied various film formation techniques. As a result, it was appropriate to use physical vapor deposition as means for developing such a coating film. The physical vapor deposition is a deposition method in which a source material (also referred to as "evaporation source" or "target") is vaporized using physical action, and the vaporized source material is adhered onto the base material. Particularly, the physical vapor deposition used in the present embodiment is preferably at least one selected from a group consisting of a cathode arc ion plating method, a balanced magnetron sputtering method, and an unbalanced magnetron sputtering method. Among these, it is more preferable to employ the cathode arc ion plating method allowing for high ionization rate of the element serving as the source material. When the cathode arc ion plating method is used, a metal ion bombardment cleaning process can be performed onto a surface of the base material before forming the coating film. Hence, a cleaning time can be reduced.

In the cathode arc ion plating method, after disposing the base material in a device and disposing the target as a cathode, high current is applied to this target to cause arc discharge. Accordingly, the target is evaporated to ionize the atoms thereof to deposit them on the base material fed with negative bias voltage, thereby forming the coating film.

Further, for example, in the balanced magnetron sputtering method, the base material is disposed in the device, the target is disposed on a magnetron electrode including a magnet for forming a balanced magnetic field, and high-frequency power is applied between the magnetron electrode and the base material, thereby generating gas plasma. Ions of gas resulting from the generation of this gas plasma are collided with the target, and atoms ejected from the target are ionized to be deposited on the base material, thereby forming the coating film.

In the unbalanced magnetron sputtering method, the magnetic field generated by the magnetron electrode in the balanced magnetron sputtering method is made unbalanced, thereby forming the coating film.

<<First Step>>

In the first step, the base material is prepared. For example, a cemented carbide base material is prepared as the base material. For the cemented carbide base material, a commercially available cemented carbide base material may be used or a cemented carbide base material may be produced using a general powder metallurgy method. In the production using the general powder metallurgy method, for example, WC powder, Co powder, and the like are mixed using a ball mill or the like to obtain a powder mixture. This powder mixture is dried and then is formed into a predetermined shape, thereby obtaining a shaped body. Further, by sintering the shaped body, a WC—Co based cemented carbide (sintered material) is obtained. Next, this sintered material is subjected to a predetermined cutting edge process such as honing, thereby producing a base material composed of the WC—Co based cemented carbide. In the first step, any conventionally known base material other than the above-described base material can be prepared.

(Base Material Cleaning Step)

Before the second step described below, a base material cleaning step of cleaning the base material can be performed. For example, an ion bombardment process can be performed onto the surface of the base material before forming the coating film using the cathode arc ion plating method in the second step. Accordingly, for example, when the cemented carbide base material is used as the base material, a soft binder phase can be removed from the surface of the base material. Then, the adhesion layer is formed on the base material, thereby increasing a ratio of the hard particles in a portion of contact between the adhesion layer and the base material. In this case, 80% or more of an area of the base material in contact with the adhesion layer is preferably WC.

(Adhesion Layer Forming Step)

Further, as a result of the ion bombardment process, a precursor of the adhesion layer can be formed. Specifically, in the ion bombardment process, a target including one or more elements selected from Cr, Ti, Zr, and Nb is used, thereby attaching these elements on the surface of the base material as the precursor of the adhesion layer while cleaning the surface of the base material. Then, the step of forming the first alternating layer on the surface having these elements attached thereon, i.e., the second step described below, is performed, thereby forming the adhesion layer excellent in adhesion force together with the first alternating layer. A more desirable example of the element used for the ion bombardment process and included in the adhesion layer is Cr. Since Cr is an element that can be sublimated, less melted particles (droplets) are generated during the ion bombardment process, thereby preventing the surface roughness of the base material.

For example, the first step and the subsequent base material cleaning step can be performed as follows. In a chamber of a film formation device, a chip having an appropriate shape is disposed as the base material. For example, with reference to a film formation device shown in FIG. 5, base material 12 is attached to an outer surface of a substrate holder 21 on a rotation table 20 disposed at the center of chamber 2. A bias power supply 42 is attached to substrate holder 21.

Figure 6:
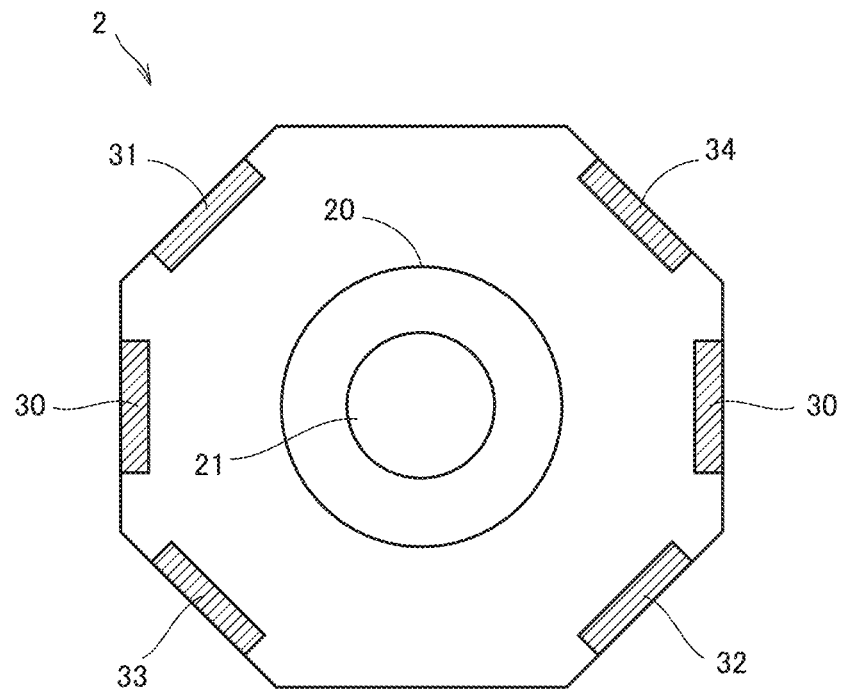
FIG. 6 is an explanatory diagram schematically showing in a plan view the film formation device used in the method for manufacturing the surface-coated cutting tool according to the present embodiment.

Next, as shown in FIG. 6, at predetermined positions in chamber 2, alloy targets each serving as a metal source material of the coating film are correspondingly attached to an evaporation source 31 for formation of the first layer, an evaporation source 32 for formation of the second layer, an evaporation source 33 for formation of the third layer, an evaporation source 34 for formation of the fourth layer, and an evaporation source 30 for ion bombardment. An arc power supply 41 is attached to evaporation source 31 for formation of the first layer, and respective arc power supplies (not shown) are attached to evaporation source 32 for formation of the second layer, evaporation source 33 for formation of the third layer, evaporation source 34 for formation of the fourth layer, and evaporation source 30 for ion bombardment.

Chamber 2 is provided with: a gas inlet 22 for introducing atmospheric gas; and a gas outlet 23 for discharging atmospheric gas from chamber 2. From this gas outlet 23, the atmospheric gas in chamber 2 can be suctioned using a vacuum pump.

First, the pressure in chamber 2 can be reduced by the vacuum pump to $1.0 \times 10^{-5}$ to $1.0 \times 10^{-3}$ Pa and rotation table 20 is rotated. Then, the temperature of base material 12 is heated at 400 to 700° C. using a heater (not shown) disposed in the device while rotating base material 12 of substrate holder 21.

Next, the argon gas is introduced as atmospheric gas from gas inlet 22, the pressure in chamber 2 is held at 1.0 to 4.0 Pa, the voltage of bias power supply 42 is gradually increased to be −1000 to −400 V, and the surface of base material 12 is cleaned for 15 to 90 minutes. Accordingly, when base material 12 is a cemented carbide base material, the binder phase can be removed from the surface.

Evaporation source 30 for ion bombardment is fed with an arc current of 100 to 200 A and the surface of the base material is subjected to the ion bombardment process for 15 to 90 minutes, thereby further cleaning the surface of the base material and attaching the metal element onto the surface.

<<Second Step>>

In the second step, the first alternating layer is formed in which the one or plurality of the first layers and the one or plurality of the second layers are layered alternately. In order to achieve this, various types of methods are used in accordance with the compositions of the first and second layers to be formed. Examples of the methods include: a method employing an alloy target having different sizes of particles such as Ti, Cr, Al and Si; a method employing a plurality of targets having different compositions; a method in which pulse voltage is employed for the bias voltage to be applied during film formation or a method in which a gas flow rate is changed during film formation; a method in which the rotational speed of the substrate holder holding the base material is adjusted in the film formation device; and the like. The first alternating layer can also be formed in combination with these methods.

For example, the second step can be performed as follows. Specifically, after cleaning base material 12, nitrogen is introduced as a reactive gas while rotating base material 12 at the center. Further, while maintaining a temperature of base material 12 to fall within a range of 400 to 700° C., a reactive gas pressure to fall within a range of 1.0 to 5.0 Pa, and a voltage of bias power supply 42 to fall within a range of −30 to 800 V, or while gradually changing them, an arc current of 100 to 200 A is supplied to each of evaporation source 31 for formation of the first layer and evaporation source 32 for formation of the second layer. Accordingly, metal ions are generated from evaporation source 31 and evaporation source 32, and supply of the arc current is stopped upon passage of a predetermined time, thereby forming the first alternating layer on the surface of base material 12. On this occasion, the first alternating layer is produced by alternately layering, one by one, the first and second layers having the compositions while controlling the rotational speed of base material 12 to attain predetermined thicknesses ($\lambda 1$, $\lambda 2$) and predetermined layer thickness ratio ($\lambda 1/\lambda 2$). Further, by adjusting a film formation time, the thickness of the first alternating layer is adjusted to fall within the predetermined range.

Particularly, the uppermost layer and lowermost layer of the first alternating layer can be produced as the first or second layer by limiting the evaporation source used when forming each layer (i.e., by designating one of evaporation source 31 for formation of the first layer and evaporation source 32 for formation of the second layer). For example, when forming the first layer as the lowermost layer, only the first layer can be formed by setting, at 0 A, the arc current of evaporation source 32 for formation of the second layer. Further, when both or one of the uppermost layer and the lowermost layer of the first alternating layer are/is mixed layer(s), the mixed layer(s) can be produced, by increasing the rotational speed of rotation table 20, as layer(s) in which the first and second layers are mixed.

<<Third Step>>

In the third step, the second alternating layer is formed in which the one or plurality of the third layers and the one or plurality of the fourth layers are layered alternately. In order to achieve this, as with the second step, various types of methods are used in accordance with the compositions of the third and fourth layers to be formed. Examples of the methods include: a method employing an alloy target having different sizes of particles such as Ti, Cr, Al, and Si or B; a method employing a plurality of targets having different compositions; a method in which pulse voltage is employed for the bias voltage to be applied during film formation or a method in which a gas flow rate is changed during film formation; a method in which the rotational speed of the substrate holder holding the base material is adjusted in the film formation device; and the like. The second alternating layer can also be formed in combination with these methods.

For example, the third step can be performed as follows. Specifically, while maintaining the temperature of base material 12, the reactive gas pressure, and the bias voltage as illustrated in the example in which the second step is performed, an arc current of 100 to 200 A is supplied to each of evaporation source 33 for formation of the third layer and evaporation source 34 for formation of the fourth layer, thereby generating metal ions from evaporation source 33 and evaporation source 34. Then, the supply of the arc current is stopped upon passage of a predetermined time, and the second alternating layer is formed on the first alternating layer. On this occasion, the second alternating layer is produced by alternately layering, one by one, the third and fourth layers having the above-described compositions while controlling the rotational speed of base material 12 to attain predetermined thicknesses ($\lambda 3$, $\lambda 4$) and predetermined layer thickness ratio ($\lambda 3/\lambda 4$). Further, by adjusting the film formation time, the thickness of the second alternating layer is adjusted to fall within the predetermined range. Particularly, the second alternating layer can be controlled to satisfy $0.05 \leq |g-e| \leq 0.2$ and $0.05 \leq |h-f| \leq 0.2$ by appropriately adjusting the composition of the metal source material used for each of evaporation source 33 and evaporation source 34, for example.

After forming the first alternating layer and the second alternating layer, compressive residual stress may be provided to the coating film because toughness is improved. Compressive residual stress can be provided by a blasting method, a brushing method, a barrel method, an ion implantation method, or the like, for example.

EXAMPLES

While the present invention will be described in detail with reference to Examples, the present invention is not limited thereto.

<Production of Surface-Coated Cutting Tool>

Figure 5:
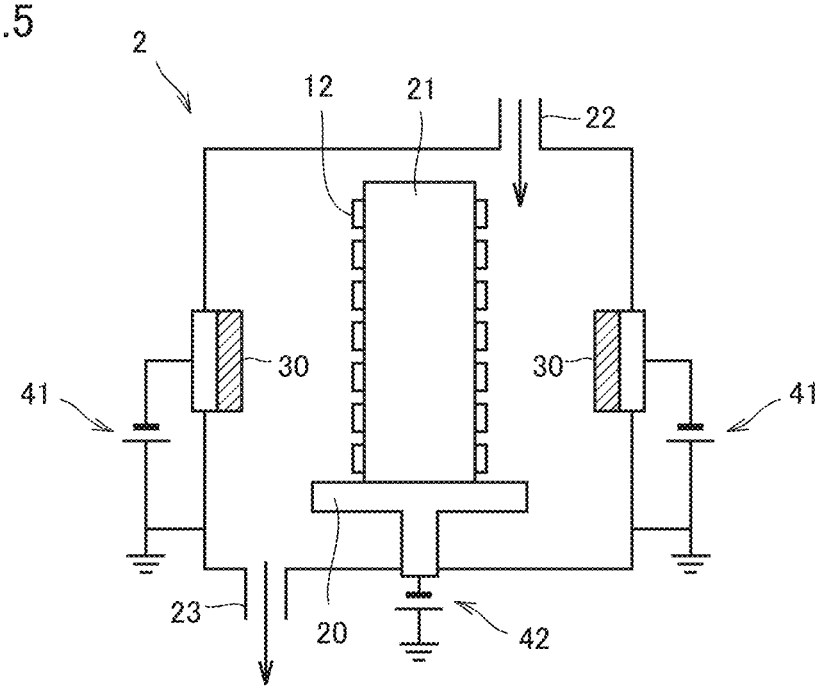
FIG. 5 is an explanatory diagram schematically showing in a cross sectional view a film formation device used in a method for manufacturing the surface-coated cutting tool according to the present embodiment.

FIG. 5 shows an explanatory schematic side perspective view of a film formation device (cathode arc ion plating device) used in the present example. FIG. 6 shows an explanatory schematic plan perspective view of the cathode arc ion plating device shown in FIG. 5.

(Preparation and Cleaning of Base material)

Base material 12 is prepared in chamber 2 of this film formation device. In the present example, a chip was employed as base material 12. The chip was a cemented carbide having a grade of P30 in the ISO standard and having a shape of SFKN 12T3AZTN in the JIS standard. As shown in FIG. 5, base material 12 was attached to the outer surface of substrate holder 21 on rotation table 20 disposed in chamber 2 at the center.

As shown in FIG. 6, the following evaporation sources, each of which was an alloy target to serve as a metal source material of the coating film, were attached to chamber 2: evaporation source 31 for formation of the first layer (alloy evaporation source composed of a metal source material having a composition to constitute the first layer); evaporation source 32 for formation of the second layer (alloy evaporation source composed of a metal source material having a composition to constitute the second layer); evaporation source 33 for formation of the third layer (alloy evaporation source composed of a metal source material having a composition to constitute the third layer); and evaporation source 34 for formation of the fourth layer (alloy evaporation source composed of a metal source material having a composition to constitute the fourth layer).

As shown in FIG. 5, an arc power supply 41 was attached to evaporation source 31 for formation of the first layer. Further, respective arc power supplies (not shown) were attached to evaporation source 32 for formation of the second layer, evaporation source 33 for formation of the third layer, evaporation source 34 for formation of the fourth layer, and evaporation source 30 for ion bombardment.

A bias power supply 42 was attached to substrate holder 21. Since gas inlet 22 for introducing atmospheric gas and gas outlet 23 for discharging the atmospheric gas from chamber 2 are provided in chamber 2, the atmospheric gas in chamber 2 can be suctioned and discharged from gas outlet 23 using a vacuum pump.

First, in the film formation device shown in FIG. 5 and FIG. 6, the pressure in chamber 2 was reduced using the vacuum pump and rotation table 20 was rotated, thereby rotating base material 12 of substrate holder 21. Then, the heater (not shown) disposed in the device was used to heat the surface temperature of base material 12 at 500° C. and chamber 2 was vacuumed until the pressure in chamber 2 becomes $1.0 \times 10^{-4}$ Pa.

Next, the following process was performed: argon gas was introduced as atmospheric gas from gas inlet 22; the pressure in chamber 2 was held at 3.0 Pa; the voltage of bias power supply 42 was gradually increased to be −1000 V; the surface of base material 12 was cleaned; and the binder phase was removed from the surface of base material 12. Then, the argon gas was discharged from the inside of chamber 2.

(Formation of Coating Film)

In Examples 1 to 11, 13, and 15 to 23, after cleaning base material 12, nitrogen was introduced as a reactive gas while rotating base material 12 at the center. Further, while maintaining a temperature of base material 12 at 500° C., a reactive gas pressure at 2.0 Pa, and a voltage of bias power supply 42 at a certain value in a range of −30 V to 800 V, or while gradually changing them, an arc current of 100 A was supplied to each of evaporation source 31 for formation of the first layer and evaporation source 32 for formation of the second layer. Accordingly, metal ions were generated from evaporation source 31 and evaporation source 32, and supply of the arc current was stopped upon passage of a predetermined time, thereby forming, on the surface of base material 12, the first alternating layer having the composition shown in Table 1. On this occasion, the first alternating layer was produced by alternately layering, one by one, the first and second layers having the compositions shown in Table 1 while adjusting the rotational speed of base material 12 to attain thicknesses and layer thickness ratio (λ1/λ2) shown in Table 1.

In each of Examples 12 and 14, the first alternating layer was produced in the same manner as described above except that methane gas was introduced as the reactive gas in addition to nitrogen, thereby forming each of the first and second layers into a carbonitride.

Particularly, a ratio (layer thickness ratio) of the thickness of one first layer and the thickness of one second layer was adjusted by controlling the rotational speed of rotation table 20 as described in Table 1.

Here, as shown in Table 1, each of the uppermost layer and the lowermost layer was constituted of a mixed layer of the first layer and the second layer in each of Examples 1 to 4, and each of the uppermost layer and the lowermost layer was constituted of one of the first layer and the second layer in Examples 5 to 23. In each of Comparative Examples 1, 2, and 7, for a layer corresponding to the first alternating layer, a TiN layer was produced as a single layer. In each of Comparative Examples 3 to 5 and 8, for a layer corresponding to the first alternating layer, a first layer as shown in Table 1 was produced as a single layer. Comparative Example 6 is an example in which no second alternating layer is formed as described below. Comparative Example 9 was produced in the same manner as in Example 1 except that: each of the lowermost layer and the uppermost layer was constituted of the second layer; the layer thickness ratio (λ1/λ2) was 5; and the below-described composition ratio in the second alternating layer satisfied neither of $0.05 \leq |g-e| \leq 0.2$ and $0.05 \leq |h-f| \leq 0.2$. In this way, the second step was performed.

It should be noted that in each of Examples 5 to 23, each of the uppermost and lowermost layers of the first alternating layer was produced by forming a film by using only one of two surfaces of the evaporation source for formation of the first alternating layer. The mixed layer in each of Examples 1 to 4 was produced by increasing the rotational speed of rotation table 20 to provide a layer in which the first and second layers were mixed.

TABLE 1

| | First Alternating Layer (Wear-Resistant Layer) | | | | | | | |
|---|---|---|---|---|---|---|---|---|
| | First Layer | | Second Layer | | Lowermost Layer | Uppermost Layer | | |
| | Composition | λ1 (μm) | Composition | λ2 (μm) | of First Alternating Layer | of First Alternating Layer | λ1/λ2 | Thickness (μm) |
| Example 1 | $Al_{0.7}Cr_{0.3}N$ | 0.042 | $Al_{0.5}Ti_{0.5}N$ | 0.007 | Mixed Layer | Mixed Layer | 6 | 2.4 |
| Example 2 | $Al_{0.7}Cr_{0.3}N$ | 0.048 | $Al_{0.6}Ti_{0.4}N$ | 0.008 | Mixed Layer | Mixed Layer | 6 | 2.4 |
| Example 3 | $Al_{0.7}Cr_{0.3}N$ | 0.06 | $Al_{0.6}Ti_{0.4}N$ | 0.01 | Mixed Layer | Mixed Layer | 6 | 2.4 |
| Example 4 | $Al_{0.7}Cr_{0.3}N$ | 0.54 | $Al_{0.6}Ti_{0.4}N$ | 0.09 | Mixed Layer | Mixed Layer | 6 | 2.4 |
| Example 5 | $Al_{0.7}Cr_{0.3}N$ | 0.42 | $Al_{0.6}Ti_{0.4}N$ | 0.07 | First Layer | First Layer | 6 | 2.4 |
| Example 6 | $Al_{0.7}Cr_{0.3}N$ | 0.42 | $Al_{0.6}Ti_{0.4}N$ | 0.07 | Second Layer | First Layer | 6 | 2.4 |
| Example 7 | $Al_{0.7}Cr_{0.3}N$ | 0.36 | $Al_{0.6}Ti_{0.4}N$ | 0.06 | First Layer | Second Layer | 6 | 2.4 |
| Example 8 | $Al_{0.7}Cr_{0.3}N$ | 0.48 | $Al_{0.6}Ti_{0.4}N$ | 0.08 | Second Layer | Second Layer | 6 | 2.4 |
| Example 9 | $Al_{0.7}Cr_{0.3}N$ | 0.36 | $Al_{0.6}Ti_{0.4}N$ | 0.09 | Second Layer | Second Layer | 4 | 2.4 |
| Example 10 | $Al_{0.7}Cr_{0.3}N$ | 0.4 | $Al_{0.6}Ti_{0.4}N$ | 0.1 | Second Layer | Second Layer | 4 | 2.4 |
| Example 11 | $Al_{0.7}Cr_{0.3}N$ | 0.24 | $Al_{0.6}Ti_{0.4}N$ | 0.06 | Second Layer | Second Layer | 4 | 2.4 |
| Example 12 | $Al_{0.7}Cr_{0.3}CN$ | 0.32 | $Al_{0.6}Ti_{0.4}CN$ | 0.08 | Second Layer | Second Layer | 4 | 2.4 |
| Example 13 | $Al_{0.7}Cr_{0.3}N$ | 0.28 | $Al_{0.6}Ti_{0.4}N$ | 0.07 | Second Layer | Second Layer | 4 | 2.4 |
| Example 14 | $Al_{0.7}Cr_{0.3}CN$ | 0.24 | $Al_{0.6}Ti_{0.4}CN$ | 0.06 | Second Layer | Second Layer | 4 | 2.4 |

TABLE 1-continued

First Alternating Layer (Wear-Resistant Layer)

| | First Layer Composition | λ1 (μm) | Second Layer Composition | λ2 (μm) | Lowermost Layer of First Alternating Layer | Uppermost Layer of First Alternating Layer | λ1/λ2 | Thickness (μm) |
|---|---|---|---|---|---|---|---|---|
| Example 15 | $Al_{0.7}Cr_{0.3}N$ | 0.36 | $Al_{0.6}Ti_{0.4}N$ | 0.09 | Second Layer | Second Layer | 4 | 2.4 |
| Example 16 | $Al_{0.7}Cr_{0.3}N$ | 0.4 | $Al_{0.6}Ti_{0.4}N$ | 0.1 | Second Layer | Second Layer | 4 | 2.4 |
| Example 17 | $Al_{0.6}Cr_{0.3}B_{0.1}N$ | 0.28 | $Al_{0.6}Ti_{0.3}B_{0.1}N$ | 0.07 | Second Layer | Second Layer | 4 | 3.2 |
| Example 18 | $Al_{0.65}Cr_{0.3}Si_{0.05}N$ | 0.24 | $Al_{0.6}Ti_{0.35}Si_{0.05}N$ | 0.06 | Second Layer | Second Layer | 4 | 3.2 |
| Example 19 | $Al_{0.65}Cr_{0.3}B_{0.05}N$ | 0.24 | $Al_{0.6}Ti_{0.35}Si_{0.05}N$ | 0.06 | Second Layer | Second Layer | 4 | 3.2 |
| Example 20 | $Al_{0.7}Cr_{0.3}N$ | 0.24 | $Al_{0.6}Ti_{0.4}N$ | 0.06 | Second Layer | Second Layer | 4 | 0.4 |
| Example 21 | $Al_{0.7}Cr_{0.3}N$ | 0.24 | $Al_{0.6}Ti_{0.4}N$ | 0.06 | Second Layer | Second Layer | 4 | 6.6 |
| Example 22 | $Al_{0.7}Cr_{0.3}N$ | 0.32 | $Al_{0.6}Ti_{0.4}N$ | 0.08 | Second Layer | Second Layer | 4 | 2.4 |
| Example 23 | $Al_{0.7}Cr_{0.3}N$ | 0.32 | $Al_{0.6}Ti_{0.4}N$ | 0.08 | Second Layer | Second Layer | 4 | 2.4 |
| Comparative Example 1 | TiN | — | — | — | — | — | — | — |
| Comparative Example 2 | TiN | — | — | — | — | — | — | — |
| Comparative Example 3 | $Al_{0.7}Cr_{0.3}N$ | — | — | — | — | — | — | — |
| Comparative Example 4 | $Al_{0.6}Ti_{0.4}N$ | — | — | — | — | — | — | — |
| Comparative Example 5 | $Al_{0.6}Ti_{0.35}Si_{0.05}N$ | — | — | — | — | — | — | — |
| Comparative Example 6 | $Al_{0.7}Cr_{0.3}N$ | — | $Al_{0.6}Ti_{0.4}N$ | — | Second Layer | Second Layer | 5 | 5.3 |
| Comparative Example 7 | TiN | — | — | — | — | — | — | 2.3 |
| Comparative Example 8 | $Al_{0.6}Ti_{0.4}N$ | — | — | — | — | — | — | 2.4 |
| Comparative Example 9 | $Al_{0.7}Cr_{0.3}N$ | — | $Al_{0.5}Ti_{0.5}N$ | — | Second Layer | Second Layer | 5 | 2.4 |

Next, in each of Examples 1 to 12 and 15 to 23, while maintaining the temperature of base material 12, the reactive gas pressure, and the bias voltage as described above, an arc current of 100 A was supplied to each of evaporation source 33 for formation of the third layer and evaporation source 34 for formation of the fourth layer, thereby generating metal ions from evaporation source 33 and evaporation source 34. Upon passage of a predetermined time, the supply of the arc current is stopped, thereby forming a second alternating layer having a composition shown in Table 2 on the first alternating layer. On this occasion, the second alternating layer was produced by alternately layering, one by one, the third and fourth layers having the compositions shown in Table 2 while adjusting the rotational speed of base material 12 to attain thicknesses (λ3, λ4) and layer thickness ratio (λ3/λ4) shown in Table 1. In each of Examples 13 and 14, the second alternating layer was produced in the same manner as described above except that methane gas was introduced as the reactive gas in addition to nitrogen to form each of the third and fourth layers into a carbonitride. It should be noted that a ratio (layer thickness ratio) of the thickness of one third layer and the thickness of one fourth layer was adjusted by controlling the rotational speed of rotation table 20 as described in Table 2. In this way, the third step was performed.

Particularly, by employing a combination of metal source materials having different compositions for the third layer and the fourth layer, the second alternating layer was produced to satisfy $0.05 \leq |g-e| \leq 0.2$ and $0.05 \leq |h-f| \leq 0.2$.

In each of Comparative Examples 1 to 6, no second alternating layer was formed. In each of Comparative Examples 7 and 8, the second alternating layer was produced in the same manner as in Example 2. In Comparative Example 9, however, the compositions of the third and fourth layers were as shown in Table 2, so that $0.05 \leq |g-e| \leq 0.2$ and $0.05 \leq |h-f| \leq 0.2$ were not satisfied.

TABLE 2

Second Alternating Layer (Chipping-Resistant Layer)

| | Third Layer Composition | λ3 (μm) | Fourth Layer Composition | λ4 (μm) | Difference between Atomic Ratios of Al $|g-e|$ | Difference between Atomic Ratios of Ti $|h-f|$ | λ3/λ4 | Thickness (μm) |
|---|---|---|---|---|---|---|---|---|
| Example 1 | $Al_{0.6}Ti_{0.4}N$ | 0.48 | $Al_{0.07}Ti_{0.3}N$ | 0.08 | 0.1 | 0.1 | 6 | 3.2 |
| Example 2 | $Al_{0.55}Ti_{0.45}N$ | 0.48 | $Al_{0.61}Ti_{0.39}N$ | 0.08 | 0.06 | 0.06 | 6 | 3.2 |
| Example 3 | $Al_{0.55}Ti_{0.45}N$ | 0.54 | $Al_{0.65}Ti_{0.35}N$ | 0.09 | 0.1 | 0.1 | 6 | 3.3 |
| Example 4 | $Al_{0.45}Ti_{0.55}N$ | 0.42 | $Al_{0.65}Ti_{0.35}N$ | 0.07 | 0.2 | 0.2 | 6 | 3.1 |
| Example 5 | $Al_{0.55}Ti_{0.45}N$ | 0.36 | $Al_{0.65}Ti_{0.35}N$ | 0.06 | 0.1 | 0.1 | 6 | 3.2 |
| Example 6 | $Al_{0.55}Ti_{0.45}N$ | 0.48 | $Al_{0.65}Ti_{0.35}N$ | 0.08 | 0.1 | 0.1 | 6 | 3.2 |
| Example 7 | $Al_{0.55}Ti_{0.45}N$ | 0.42 | $Al_{0.65}Ti_{0.35}N$ | 0.07 | 0.1 | 0.1 | 6 | 3.2 |
| Example 8 | $Al_{0.55}Ti_{0.45}N$ | 0.54 | $Al_{0.65}Ti_{0.35}N$ | 0.09 | 0.1 | 0.1 | 6 | 3.2 |

TABLE 2-continued

| | Second Alternating Layer (Chipping-Resistant Layer) | | | | | | | |
|---|---|---|---|---|---|---|---|---|
| | Third Layer | | Fourth Layer | | Difference between Atomic Ratios of Al $\|g - e\|$ | Difference between Atomic Ratios of Ti $\|h - f\|$ | $\lambda 3/\lambda 4$ | Thickness (μm) |
| | Composition | $\lambda 3$ (μm) | Composition | $\lambda 4$ (μm) | | | | |
| Example 9 | $Al_{0.55}Ti_{0.45}N$ | 0.6 | $Al_{0.65}Ti_{0.35}N$ | 0.1 | 0.1 | 0.1 | 6 | 3.2 |
| Example 10 | $Al_{0.55}Ti_{0.45}N$ | 0.36 | $Al_{0.65}Ti_{0.35}N$ | 0.09 | 0.1 | 0.1 | 4 | 3.2 |
| Example 11 | $Al_{0.55}Ti_{0.45}N$ | 0.24 | $Al_{0.65}Ti_{0.35}N$ | 0.06 | 0.1 | 0.1 | 4 | 3.2 |
| Example 12 | $Al_{0.55}Ti_{0.45}N$ | 0.28 | $Al_{0.65}Ti_{0.35}N$ | 0.07 | 0.1 | 0.1 | 4 | 3.2 |
| Example 13 | $Al_{0.55}Ti_{0.45}CN$ | 0.28 | $Al_{0.65}Ti_{0.35}CN$ | 0.07 | 0.1 | 0.1 | 4 | 3.2 |
| Example 14 | $Al_{0.55}Ti_{0.45}CN$ | 0.28 | $Al_{0.65}Ti_{0.35}CN$ | 0.07 | 0.1 | 0.1 | 4 | 3.2 |
| Example 15 | $Al_{0.55}Ti_{0.45}N$ | 0.24 | $Al_{0.65}Ti_{0.35}N$ | 0.06 | 0.1 | 0.1 | 4 | 3.2 |
| Example 16 | $Al_{0.55}Ti_{0.45}N$ | 0.24 | $Al_{0.65}Ti_{0.35}N$ | 0.06 | 0.1 | 0.1 | 4 | 3.2 |
| Example 17 | $Al_{0.55}Ti_{0.35}B_{0.1}N$ | 0.32 | $Al_{0.6}Ti_{0.3}B_{0.1}N$ | 0.08 | 0.05 | 0.05 | 4 | 2.3 |
| Example 18 | $Al_{0.55}Ti_{0.4}Si_{0.05}N$ | 0.36 | $Al_{0.65}Ti_{0.3}Si_{0.05}N$ | 0.09 | 0.1 | 0.1 | 4 | 2.3 |
| Example 19 | $Al_{0.55}Ti_{0.4}Si_{0.05}N$ | 0.32 | $Al_{0.65}Ti_{0.3}Si_{0.05}N$ | 0.08 | 0.1 | 0.1 | 4 | 2.3 |
| Example 20 | $Al_{0.55}Ti_{0.45}N$ | 0.28 | $Al_{0.65}Ti_{0.35}N$ | 0.07 | 0.1 | 0.1 | 4 | 0.5 |
| Example 21 | $Al_{0.55}Ti_{0.45}N$ | 0.24 | $Al_{0.65}Ti_{0.35}N$ | 0.06 | 0.1 | 0.1 | 4 | 7.2 |
| Example 22 | $Al_{0.55}Ti_{0.45}N$ | 0.24 | $Al_{0.65}Ti_{0.35}N$ | 0.06 | 0.1 | 0.1 | 4 | 3.2 |
| Example 23 | $Al_{0.55}Ti_{0.45}N$ | 0.24 | $Al_{0.65}Ti_{0.35}N$ | 0.06 | 0.1 | 0.1 | 4 | 3.2 |
| Comparative Example 1 | — | — | — | — | — | — | — | — |
| Comparative Example 2 | — | — | — | — | — | — | — | — |
| Comparative Example 3 | — | — | — | — | — | — | — | — |
| Comparative Example 4 | — | — | — | — | — | — | — | — |
| Comparative Example 5 | — | — | — | — | — | — | — | — |
| Comparative Example 6 | — | — | — | — | — | — | — | — |
| Comparative Example 7 | $Al_{0.55}Ti_{0.45}N$ | — | $Al_{0.61}Ti_{0.39}N$ | — | 0.06 | 0.06 | 6 | 3.2 |
| Comparative Example 8 | $Al_{0.55}Ti_{0.45}N$ | — | $Al_{0.61}Ti_{0.39}N$ | — | 0.06 | 0.06 | 6 | 3.2 |
| Comparative Example 9 | $Al_{0.4}Ti_{0.6}N$ | — | $Al_{0.7}Ti_{0.3}N$ | — | 0.3 | 0.3 | 4 | 3 |

TABLE 3

Relation between Composition of Wear-Resistant Layer and Composition of Chipping-Resistant Layer

| | Relation among Amounts of Al of Second Layer, Third Layer, and Fourth Layer | | | | Relation among Amounts of Ti of Second Layer, Third Layer, and Fourth Layer | | | |
|---|---|---|---|---|---|---|---|---|
| | e | c | g | $e \leq c \leq g$ | h | d | f | $h \leq d \leq f$ |
| Example 1 | 0.6 | 0.5 | 0.7 | Not Satisfied | 0.3 | 0.5 | 0.4 | Not Satisfied |
| Example 2 | 0.55 | 0.6 | 0.61 | Satisfied | 0.39 | 0.4 | 0.45 | Satisfied |
| Example 3 | 0.55 | 0.6 | 0.65 | Satisfied | 0.35 | 0.4 | 0.45 | Satisfied |
| Example 4 | 0.45 | 0.6 | 0.65 | Satisfied | 0.35 | 0.4 | 0.55 | Satisfied |
| Example 5 | 0.55 | 0.6 | 0.65 | Satisfied | 0.35 | 0.4 | 0.45 | Satisfied |
| Example 6 | 0.55 | 0.6 | 0.65 | Satisfied | 0.35 | 0.4 | 0.45 | Satisfied |
| Example 7 | 0.55 | 0.6 | 0.65 | Satisfied | 0.35 | 0.4 | 0.45 | Satisfied |
| Example 8 | 0.55 | 0.6 | 0.65 | Satisfied | 0.35 | 0.4 | 0.45 | Satisfied |
| Example 9 | 0.55 | 0.6 | 0.65 | Satisfied | 0.35 | 0.4 | 0.45 | Satisfied |
| Example 10 | 0.55 | 0.6 | 0.65 | Satisfied | 0.35 | 0.4 | 0.45 | Satisfied |
| Example 11 | 0.55 | 0.6 | 0.65 | Satisfied | 0.35 | 0.4 | 0.45 | Satisfied |
| Example 12 | 0.55 | 0.6 | 0.65 | Satisfied | 0.35 | 0.4 | 0.45 | Satisfied |
| Example 13 | 0.55 | 0.6 | 0.65 | Satisfied | 0.35 | 0.4 | 0.45 | Satisfied |
| Example 14 | 0.55 | 0.6 | 0.65 | Satisfied | 0.35 | 0.4 | 0.45 | Satisfied |
| Example 15 | 0.55 | 0.6 | 0.65 | Satisfied | 0.35 | 0.4 | 0.45 | Satisfied |
| Example 16 | 0.55 | 0.6 | 0.65 | Satisfied | 0.35 | 0.4 | 0.45 | Satisfied |
| Example 17 | 0.55 | 0.6 | 0.65 | Satisfied | 0.25 | 0.3 | 0.35 | Satisfied |
| Example 18 | 0.55 | 0.6 | 0.65 | Satisfied | 0.3 | 0.35 | 0.4 | Satisfied |
| Example 19 | 0.55 | 0.6 | 0.65 | Satisfied | 0.3 | 0.35 | 0.4 | Satisfied |
| Example 20 | 0.55 | 0.6 | 0.65 | Satisfied | 0.35 | 0.4 | 0.45 | Satisfied |
| Example 21 | 0.55 | 0.6 | 0.65 | Satisfied | 0.35 | 0.4 | 0.45 | Satisfied |
| Example 22 | 0.55 | 0.6 | 0.65 | Satisfied | 0.35 | 0.4 | 0.45 | Satisfied |
| Example 23 | 0.55 | 0.6 | 0.65 | Satisfied | 0.35 | 0.4 | 0.45 | Satisfied |

TABLE 3-continued

Relation between Composition of Wear-Resistant Layer and Composition of Chipping-Resistant Layer

| | Relation among Amounts of Al of Second Layer, Third Layer, and Fourth Layer | | | | Relation among Amounts of Ti of Second Layer, Third Layer, and Fourth Layer | | | |
|---|---|---|---|---|---|---|---|---|
| | e | c | g | e ≤ c ≤ g | h | d | f | h ≤ d ≤ f |
| Comparative Example 1 | — | — | — | — | — | — | — | — |
| Comparative Example 2 | — | — | — | — | — | — | — | — |
| Comparative Example 3 | — | — | — | — | — | — | — | — |
| Comparative Example 4 | — | — | — | — | — | — | — | — |
| Comparative Example 5 | — | — | — | — | — | — | — | — |
| Comparative Example 6 | — | — | — | — | — | — | — | — |
| Comparative Example 7 | — | — | — | — | — | — | — | — |
| Comparative Example 8 | — | — | — | — | — | — | — | — |
| Comparative Example 9 | 0.4 | 0.5 | 0.7 | Satisfied | 0.3 | 0.5 | 0.6 | Satisfied |

(Formation of Adhesion Layer)

Here, in each of Examples 11 to 23, after the step related with the above-described "(Preparation and Cleaning of Base Material)", an adhesion layer having composition and thickness shown in Table 4 was formed. In Comparative Example 2, TiN having a thickness shown in Table 4 was formed as a layer corresponding to the adhesion layer.

The adhesion layer is formed by introducing both or one of nitrogen and methane as a reactive gas while rotating base material 12 at the center before the step related with "(Formation of Coating Film)" above and after cleaning base material 12. Further, while maintaining the temperature of base material 12 at 500° C., the reactive gas pressure at 2.0 Pa, and the voltage of bias power supply 42 at a certain value in a range of −30 V to −800 V or while gradually changing them, an arc current of 100 A was supplied to the alloy target (not shown) having a composition corresponding to that of the adhesion layer. Accordingly, metal ions are generated from the alloy target. Upon passage of a predetermined time, the supply of the arc current was stopped and the adhesion layer having the composition and thickness shown in Table 4 was formed on the surface of base material 12.

TABLE 4

| | Total Film Thickness (μm) | Adhesion Layer Composition | Adhesion Layer Thickness [nm] | Tool Life Continuous Cutting Distance of Cut (m) | Tool Life Intermittent Cutting Distance of Cut (m) |
|---|---|---|---|---|---|
| Example 1 | 5.6 | — | — | 900 | 720 |
| Example 2 | 5.6 | — | — | 950 | 760 |
| Example 3 | 5.7 | — | — | 1000 | 800 |
| Example 4 | 5.5 | — | — | 950 | 760 |
| Example 5 | 5.6 | — | — | 1000 | 800 |
| Example 6 | 5.6 | — | — | 1000 | 850 |
| Example 7 | 5.6 | — | — | 1200 | 960 |
| Example 8 | 5.6 | — | — | 1200 | 960 |
| Example 9 | 5.6 | — | — | 1400 | 1120 |
| Example 10 | 5.6 | — | — | 1500 | 1200 |
| Example 11 | 5.6 | $W_{0.4}Cr_{0.25}Al_{0.2}Ti_{0.15}CN$ | 5 | 1600 | 1300 |
| Example 12 | 5.6 | $W_{0.4}Cr_{0.25}Al_{0.2}Ti_{0.15}CN$ | 5 | 1600 | 1300 |
| Example 13 | 5.6 | $W_{0.4}Cr_{0.25}Al_{0.2}Ti_{0.15}CN$ | 5 | 1650 | 1300 |
| Example 14 | 5.6 | $W_{0.4}Cr_{0.25}Al_{0.2}Ti_{0.15}CN$ | 5 | 1700 | 1400 |
| Example 15 | 5.6 | $W_{0.4}Cr_{0.25}Al_{0.2}Ti_{0.15}C$ | 5 | 1600 | 1300 |
| Example 16 | 5.6 | $W_{0.4}Cr_{0.25}Al_{0.2}Ti_{0.15}N$ | 5 | 1600 | 1300 |
| Example 17 | 5.5 | $W_{0.4}Cr_{0.25}Al_{0.2}Ti_{0.1}B_{0.05}CN$ | 5 | 1600 | 1280 |
| Example 18 | 5.5 | $W_{0.4}Cr_{0.25}Al_{0.2}Ti_{0.1}Si_{0.05}CN$ | 5 | 1700 | 1450 |
| Example 19 | 5.5 | $W_{0.4}Cr_{0.25}Al_{0.2}Ti_{0.1}B_{0.02}Si_{0.03}CN$ | 5 | 1800 | 1550 |
| Example 20 | 0.9 | $W_{0.4}Cr_{0.25}Al_{0.2}Ti_{0.15}CN$ | 5 | 800 | 1300 |
| Example 21 | 13.8 | $W_{0.4}Cr_{0.25}Al_{0.2}Ti_{0.15}CN$ | 5 | 2400 | 1040 |
| Example 22 | 5.6 | $W_{0.4}Cr_{0.25}Al_{0.2}Ti_{0.15}CN$ | 0.8 | 1600 | 1300 |
| Example 23 | 5.6 | $W_{0.4}Cr_{0.25}Al_{0.2}Ti_{0.15}CN$ | 18 | 1600 | 1300 |
| Comparative Example 1 | 5.1 | — | — | 300 | 250 |
| Comparative Example 2 | 5.3 | TiN | 100 | 400 | 300 |

TABLE 4-continued

| | Total Film Thickness (μm) | AdhesionLayer Composition | Thickness [nm] | Tool Life | |
|---|---|---|---|---|---|
| | | | | Continuous Cutting | Intermittent Cutting |
| | | | | Distance of Cut (m) | |
| Comparative Example 3 | 5.5 | — | — | 400 | 300 |
| Comparative Example 4 | 5.7 | — | — | 500 | 400 |
| Comparative Example 5 | 5.6 | — | — | 600 | 500 |
| Comparative Example 6 | 5.3 | — | — | 700 | 550 |
| Comparative Example 7 | 5.5 | — | — | 550 | 600 |
| Comparative Example 8 | 5.6 | — | — | 650 | 650 |
| Comparative Example 9 | 5.4 | — | — | 750 | 600 |

In the manner described above, the surface-coated cutting tools of Examples 1 to 23 and Comparative Examples 1 to 9 were produced.

<Evaluation of Life of Surface-Coated Cutting Tool>
<<Continuous Cutting Test>>

Each of the surface-coated cutting tools of the Examples and Comparative Examples obtained in the manner described above was subjected to a continuous cutting test under below-described conditions so as to evaluate the tool life by measuring a distance (based on m as a unit) of cut until the width of flank wear became more than 0.2 mm. Results thereof are shown in Table 4. A larger value of the distance of cut represents a longer life.

Continuous Cutting Test Conditions:
Workpiece: SCM 435
Cutting speed v (m/min): 250
Feeding speed f (mm/cutting edge): 0.3
Cut amount ap (mm): 2.0
Cut amount as in radial direction (mm): 50.
<<Intermittent Cutting Test>>

Further, each of the surface-coated cutting tools of the Examples and the Comparative Examples was subjected to a dry-type intermittent cutting test under below-described conditions so as to evaluate tool life by measuring a distance of cut (based on m as a unit) until the cutting edge was chipped. Results thereof are shown in Table 4. A larger value of the distance of cut represents a longer life.

Dry-Type Intermittent Cutting Test Conditions:
Workpiece: SUS 316
Cutting speed v (m/min): 200
Feeding speed f (mm/cutting edge): 0.2
Cut amount ap (mm): 2
Cut amount as in radial direction (mm): 50.
<<Evaluation Result>>

As shown in Table 4, the surface-coated cutting tool according to each of the Examples apparently had an improved tool life as compared with the surface-coated cutting tool of each of the Comparative Examples. This is presumably because the first alternating layer constituted of the first and second layers provided improved wear resistance and the second alternating layer constituted of the third and fourth layers provided improved chipping resistance. Therefore, the surface-coated cutting tool according to each of the Examples can exhibit excellent chipping resistance and wear resistance, can endure severe cutting conditions, and can attain excellent cutting edge quality.

Particularly, it was more firmly confirmed that the tool life tends to be improved under the following conditions: the atomic ratios of Al in the second to fourth layers have the predetermined relation; the atomic ratios of Ti in the second to fourth layers have the predetermined relation; the lowermost layer of the first alternating layer is the first or second layer; the uppermost layer of the first alternating layer is the second layer; and each of $\lambda1/\lambda2$ and $\lambda3/\lambda4$ falls within the predetermined range. Further, the tool life was improved more since the adhesion layer having the predetermined composition is included.

Heretofore, the embodiments and examples of the present invention have been illustrated, but it has been initially expected to appropriately combine the configurations of the embodiments and examples and modify them in various manners.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: surface-coated cutting tool; 11: coating film; 111: adhesion layer; 112: first alternating layer; 113: second alternating layer; 12: base material; 2: chamber; 20: rotation table; 21: substrate holder; 22: gas inlet; 23: gas outlet; 30: evaporation source for ion bombardment; 31: evaporation source; 32: evaporation source; 33: evaporation source; 34: evaporation source; 41: arc power supply; 42: bias power supply.

The invention claimed is:

1. A surface-coated cutting tool comprising a base material and a coating film formed on a surface of the base material,
   the coating film including a first alternating layer and a second alternating layer formed on the first alternating layer,
   each of the first alternating layer and the second alternating layer having a cubic crystal structure,
   the first alternating layer including first and second layers,
   the second alternating layer including third and fourth layers, one or a plurality of the first layers and one or a plurality of the second layers being layered alternately, one or a plurality of the third layers and one or a plurality of the fourth layers being layered alternately, each of the one or plurality of the first layers being composed of a nitride or carbonitride of $Al_aCr_bM1_{1-a-b}$, respective atomic ratios of the metal atoms in the first layer satisfying $0.5 \leq a \leq 0.9$, $0 \leq b \leq 0.4$, and $0 \leq 1-a-b \leq 0.1$, each of the one or plurality of the second layers being composed of a nitride or carbonitride of $Al_cTi_dM2_{1-c-d}$, respective atomic ratios of the metal atoms in the second layer satisfying $0.35 \leq c \leq 0.7$, $0.3 \leq d \leq 0.7$, and $0 \leq 1-c-d \leq 0.1$, each of the one or plurality of the third layers being composed of a nitride or carbonitride of $Al_eTi_fM3_{1-e-f}$, respective atomic ratios of the metal atoms in the third layer satisfying $0.35 \leq e \leq 0.7$, $0.3 \leq f \leq 0.7$, and $0 \leq 1-e-f \leq 0.1$, each of the one or plurality of the fourth layers being composed of a nitride or carbonitride of $Al_gTi_hM4_{1-g-h}$, respective atomic ratios of the metal atoms in the fourth layer satisfying $0.35 \leq g \leq 0.7$, $0.3 \leq h \leq 0.7$, and $0 \leq 1-g-h \leq 0.1$, the atomic ratio e of Al in the third layer and the atomic ratio g of Al in the fourth layer satisfying $0.05 \leq |g-e| \leq 0.2$, the atomic ratio f of Ti in the third layer and the atomic ratio h of Ti in the fourth layer satisfying $0.05 \leq |h-f| \leq 0.2$, each of the M1, the M2, the M3, and the M4 being one or more elements selected from a group consisting of a group 4 element, a group 5 element, a group 6 element except Cr and Ti in a periodic table, Si, and B, wherein the coating film includes an adhesion layer at the base material side relative to the first alternating layer, the adhesion layer is in contact with a lowermost layer of the first alternating layer, the adhesion layer has a thickness of not less than 0.5 nm and not more than 20 nm, the adhesion layer is a carbide, nitride, or carbonitride including all of W, Cr, Ti and Al, an uppermost layer of the first alternating layer is the second layer, and the lowermost layer of the first alternating layer is the second layer.

2. The surface-coated cutting tool according to claim 1, wherein the atomic ratio c of Al in the second layer, the atomic ratio e of Al in the third layer, and the atomic ratio g of Al in the fourth layer satisfy $e < c < g$, and the atomic ratio d of Ti in the second layer, the atomic ratio f of Ti in the third layer, and the atomic ratio h of Ti in the fourth layer satisfy $h < d < f$.

3. The surface-coated cutting tool according to claim 1, wherein each of a thickness λ1 of the first layer and a thickness λ2 of the second layer is not less than 0.005 μm and not more than 2 μm, and λ1/λ2, which is a ratio of the thickness of the first layer and the thickness of the second layer, satisfies $1 \leq \lambda1/\lambda2 \leq 5$.

4. The surface-coated cutting tool according to claim 1, wherein each of a thickness λ3 of the third layer and a thickness λ4 of the fourth layer is not less than 0.005 μm and not more than 2 μm, and λ3/λ4, which is a ratio of the thickness of the third layer and the thickness of the fourth layer, satisfies $1 \leq \lambda3/\lambda4 \leq 5$.

5. The surface-coated cutting tool according to claim 1, wherein the coating film has an entire thickness of not less than 0.5 μm and not more than 15 μm.

6. The surface-coated cutting tool according to claim 1, wherein the base material includes hard particles including WC and a binder phase for binding the hard particles, the binder phase includes Co, the adhesion layer further includes M5, and the M5 is one or more elements selected from a group consisting of a group 4 element, a group 5 element, a group 6 element except W, Cr, and Ti in the periodic table, Si and B.

7. A method for manufacturing the surface-coated cutting tool recited in claim 1, the method comprising:

preparing the base material;

forming the first alternating layer by alternately layering the one or plurality of the first layers and the one or plurality of the second layers through physical vapor deposition; and forming the second alternating layer on the first alternating layer by alternately layering the one or plurality of the third layers and the one or plurality of the fourth layers through the physical vapor deposition.

8. The method for manufacturing the surface-coated cutting tool according to claim 7, wherein the physical vapor deposition is at least one selected from a group consisting of a cathode arc ion plating method, a balanced magnetron sputtering method, and an unbalanced magnetron sputtering method.

* * * * *